US012713882B2

(12) United States Patent
Yoon et al.

(10) Patent No.: US 12,713,882 B2
(45) Date of Patent: Aug. 18, 2026

(54) SEMICONDUCTOR DEVICE INCLUDING GATE LINES WITH A CONDUCTIVE LAYER HAVING LESS NITROGEN THAN AN INTERFACE LAYER AND METHOD OF FABRICATING THE SAME

(71) Applicant: Samsung Electronics Co., Ltd., Suwon-si (KR)

(72) Inventors: Taekyung Yoon, Hwaseong-si (KR); Youngjun Kim, Suwon-si (KR); Hunyoung Bark, Suwon-si (KR); Eun-Ok Lee, Suwon-si (KR); Jaejin Lee, Goyang-si (KR); Dongju Chang, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 805 days.

(21) Appl. No.: 17/957,473

(22) Filed: Sep. 30, 2022

(65) Prior Publication Data

US 2023/0290681 A1 Sep. 14, 2023

(30) Foreign Application Priority Data

Mar. 14, 2022 (KR) ........................ 10-2022-0031415

(51) Int. Cl.
*H10W 20/00* (2026.01)
*H10P 50/00* (2026.01)
*H10P 72/00* (2026.01)

(52) U.S. Cl.
CPC ........... *H10W 20/056* (2026.01); *H10P 50/00* (2026.01); *H10P 72/0432* (2026.01); *H10W 20/048* (2026.01); *H10W 20/074* (2026.01)

(58) Field of Classification Search
CPC ........... H01L 21/76877; H01L 21/3213; H01L 21/67103; H01L 21/76829;
(Continued)

(56) References Cited

U.S. PATENT DOCUMENTS 7,723,755 B2 5/2010 Lee et al.
8,203,181 B2 * 6/2012 Hirler .................. H10D 30/668 257/334
(Continued)

FOREIGN PATENT DOCUMENTS

KR 100705175 B1 4/2007
KR 20110060738 A 6/2011
(Continued)

OTHER PUBLICATIONS

European Search Report dated Jul. 12, 2023 (corresponding to EP 22209674.5).

*Primary Examiner* — Caleb E Henry
*Assistant Examiner* — Pratiksha Jayant Lohakare
(74) *Attorney, Agent, or Firm* — Harness, Dickey & Pierce, P.L.C.

(57) ABSTRACT

Provided is a method of fabricating a semiconductor device including forming a device isolation layer defining active regions on a substrate and forming gate lines intersecting the active regions and buried in the substrate. The forming of the gate lines includes forming a trench crossing the active regions in the substrate, forming a conductive layer filling the trench, and performing a heat treatment process on the conductive layer. The conductive layer includes a nitride of a first metal. Nitrogen atoms in the conductive layer are diffused toward an outer surface and a lower surface of the conductive layer by the heat treatment process.

18 Claims, 23 Drawing Sheets

(58) Field of Classification Search
CPC ......... H01L 21/76856; H01L 21/28088; H01L 21/28176; H01L 21/28525; H10B 12/053; H10B 12/488; H10B 12/34; H10B 12/315; H10D 30/60; H10D 64/027; H10D 64/513; H10D 64/667; H10D 64/01; H10D 64/512
USPC .......................................................... 438/296
See application file for complete search history.

(56) References Cited

U.S. PATENT DOCUMENTS 8,372,714 B2 * 2/2013 Wei .................. H10D 64/01324 257/334
8,530,962 B2 9/2013 Jang
8,674,434 B2 3/2014 Ananthan
8,916,918 B2 * 12/2014 Nishi ................... H10B 12/056 257/296
9,613,965 B2 * 4/2017 Ting ....................... H10B 12/34
10,720,358 B2 * 7/2020 Yin ..................... H10W 20/035
10,790,287 B2 9/2020 Kang et al.
11,631,674 B2 4/2023 Choi et al.
2007/0222071 A1 * 9/2007 Moon ............... H01L 21/76856 257/E23.01
2008/0105920 A1 5/2008 Hirano et al.
2010/0140676 A1 6/2010 Yeom
2011/0233778 A1 9/2011 Lee et al.
2014/0159145 A1 6/2014 Park et al.
2016/0172488 A1 * 6/2016 Oh ....................... H10D 64/513 257/330
2017/0125532 A1 5/2017 Jang
2019/0088756 A1 * 3/2019 Fang .................... H10D 84/853
2019/0267386 A1 * 8/2019 Lee .................... H10D 30/0221
2020/0105765 A1 * 4/2020 Kim ....................... H10B 12/34
2020/0176451 A1 6/2020 Kang et al.
2021/0118982 A1 4/2021 Song et al.

FOREIGN PATENT DOCUMENTS

KR 20110078115 A * 7/2011 ........... H10B 12/482
KR 101520380 B1 5/2015
KR 20160106383 A 9/2016
KR 20200084988 A 7/2020
TW 202207471 A 2/2022

* cited by examiner

SEMICONDUCTOR DEVICE INCLUDING GATE LINES WITH A CONDUCTIVE LAYER HAVING LESS NITROGEN THAN AN INTERFACE LAYER AND METHOD OF FABRICATING THE SAME

CROSS-REFERENCE TO RELATED APPLICATIONS

This U.S. non-provisional patent application claims priority under 35 U.S.C. § 119 to Korean Patent Application No. 10-2022-0031415, filed on Mar. 14, 2022, in the Korean Intellectual Property Office, the entire contents of which are hereby incorporated by reference.

BACKGROUND

1. Field

The inventive concepts relate to semiconductor devices and/or methods of fabricating the same, and more particularly, to semiconductor devices including buried gate lines and/or methods of fabricating the same.

2. Description of the Related Art

Due to characteristics such as miniaturization, multifunctionality, and low manufacturing cost, a semiconductor device is in the spotlight as an important element in an electronics industry. The semiconductor devices may be classified into a semiconductor memory device for storing logic data, a semiconductor logic device for processing logic data, and a hybrid semiconductor device including a memory element and a logic element.

Recently, in accordance with high speed and low power consumption of an electronic device, a semiconductor device embedded therein is also required to have high operating speed and low operating voltage. To satisfy these required characteristics, the semiconductor device becomes more highly integrated. As the semiconductor device is highly integrated, reliability of the semiconductor device may deteriorate. However, as the electronic industry is highly developed, the demand for high reliability of the semiconductor device is increasing. Accordingly, many studies are being conducted to improve the reliability of the semiconductor device.

SUMMARY

Some example embodiments of the inventive concepts provide a semiconductor device having improved electrical characteristics and a method for manufacturing the same.

According to some example embodiments of the present inventive concepts, a method of fabricating a semiconductor device may include forming a device isolation layer defining active regions on a substrate, and forming gate lines intersecting the active regions and buried in the substrate, the forming of the gate lines may include forming a trench intersecting the active regions in the substrate, forming a conductive layer filling the trench, and performing a heat treatment process on the conductive layer, the conductive layer may include a nitride of a first metal, and nitrogen atoms in the conductive layer may be diffused toward an outer surface and a lower surface of the conductive layer by the heat treatment process.

According to some example embodiments of the present inventive concepts, a method of fabricating a semiconductor device may include forming a device isolation layer defining active regions on a substrate, forming trenches intersecting the active regions, forming a conductive layer filling a lower portion of each of the trenches, the conductive layer including a nitride of a first metal, forming a first interface layer adjacent to an outer surface and a lower surface of the conductive layer, the first interface layer including a nitride of the first metal, and forming a capping layer filling an upper portion of each of the trenches, a nitrogen concentration in the first interface layer may be higher than a nitrogen concentration in the conductive layer.

According to some example embodiments of the present inventive concepts, a semiconductor device may include a device isolation layer defining active regions of a substrate, and gate lines intersecting the active regions and buried in a trench of the substrate, each of the gate lines may include an interface layer covering sidewalls and a bottom surface of the trench, a conductive layer filling a remainder of the trench on the interface layer, and a capping layer filling an upper portion of the trench on the interface layer and the conductive layer, each of the conductive layer and the interface layer may include a nitride of a first metal, and a nitrogen concentration in the interface layer may be higher than a nitrogen concentration in the conductive layer.

BRIEF DESCRIPTION OF THE DRAWINGS

The drawings described herein are for illustrative purposes only of selected embodiments and not all possible implementations, and are not intended to limit the scope of the present disclosure.

FIGS. 5A to 10A are cross-sections for explaining a method of fabricating a semiconductor device according to some example embodiments of the present inventive concepts, and correspond to cross-sections taken along line I-I' of FIG. 1.

FIGS. 5B to 10B are cross-sections for explaining a method of fabricating a semiconductor device according to some example embodiments of the present inventive concepts, and correspond to cross-sections taken along line II-IP of FIG. 1.

FIGS. 11A to 13A are cross-sections for explaining a method of fabricating a semiconductor device according to some example embodiments of the present inventive concepts, and correspond to cross-sections taken along line I-I' of FIG. 1.

FIGS. 11B to 13B are cross-sections for explaining a method of fabricating a semiconductor device according to some example embodiments of the present inventive concepts, and correspond to cross-sections taken along line II-IP of FIG. 1.

DETAILED DESCRIPTION

A semiconductor device according to the inventive concepts will be described with reference to the drawings.

Figure 1:
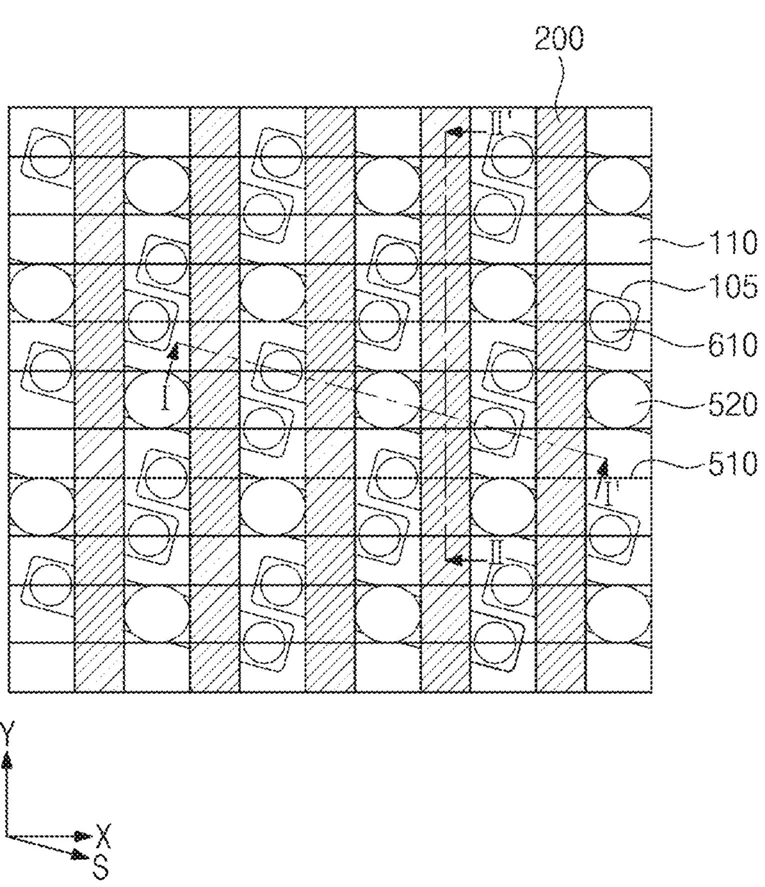
FIG. 1 is a cross-sectional view for explaining a semiconductor device according to some example embodiments of the present inventive concepts.
Figure 2A:
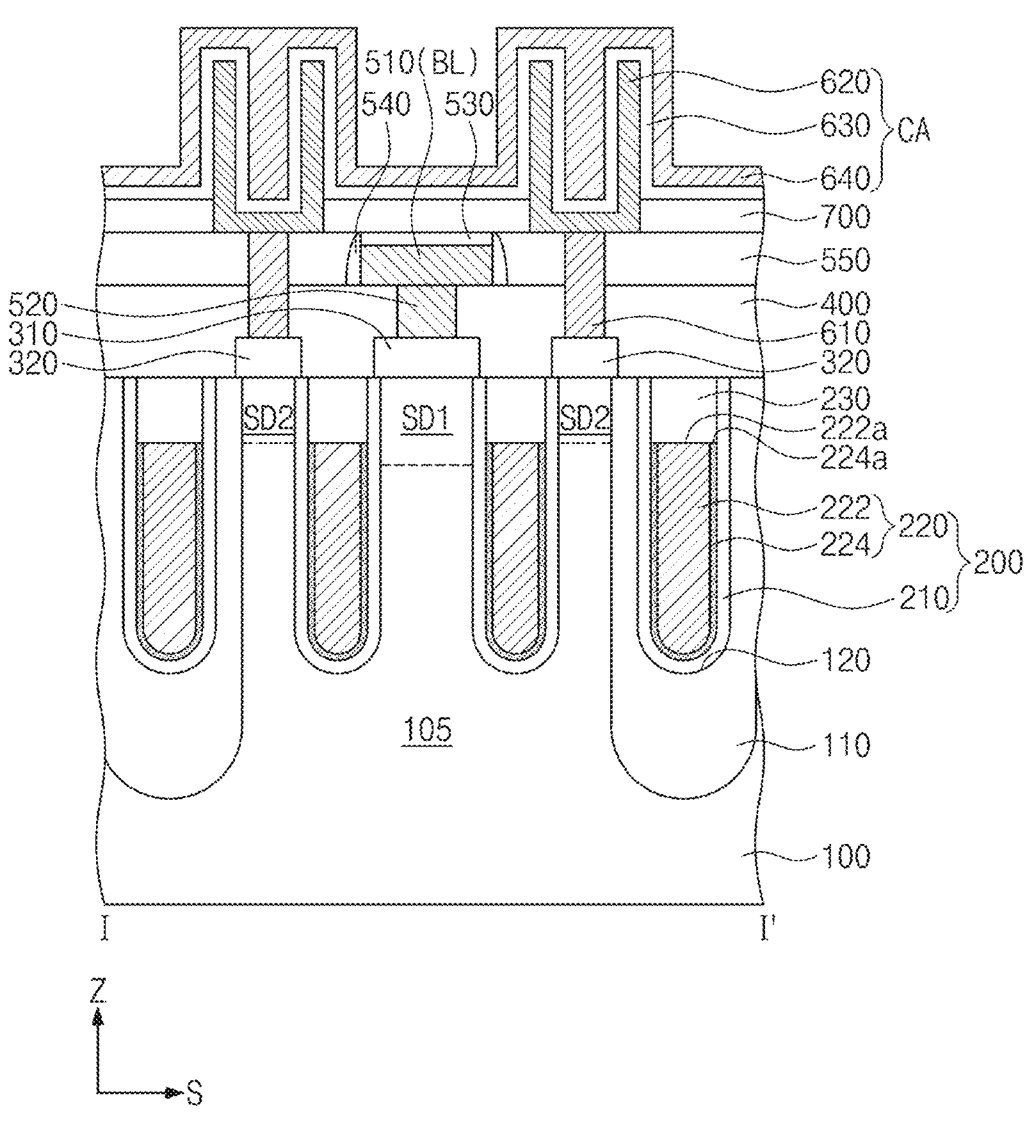
FIGS. 2A and 2B are cross-sections for explaining a semiconductor device according to some example embodiments of the present inventive concepts, and correspond to cross-sections taken along lines I-I' and II-IP of FIG. 1, respectively.
Figure 2B:
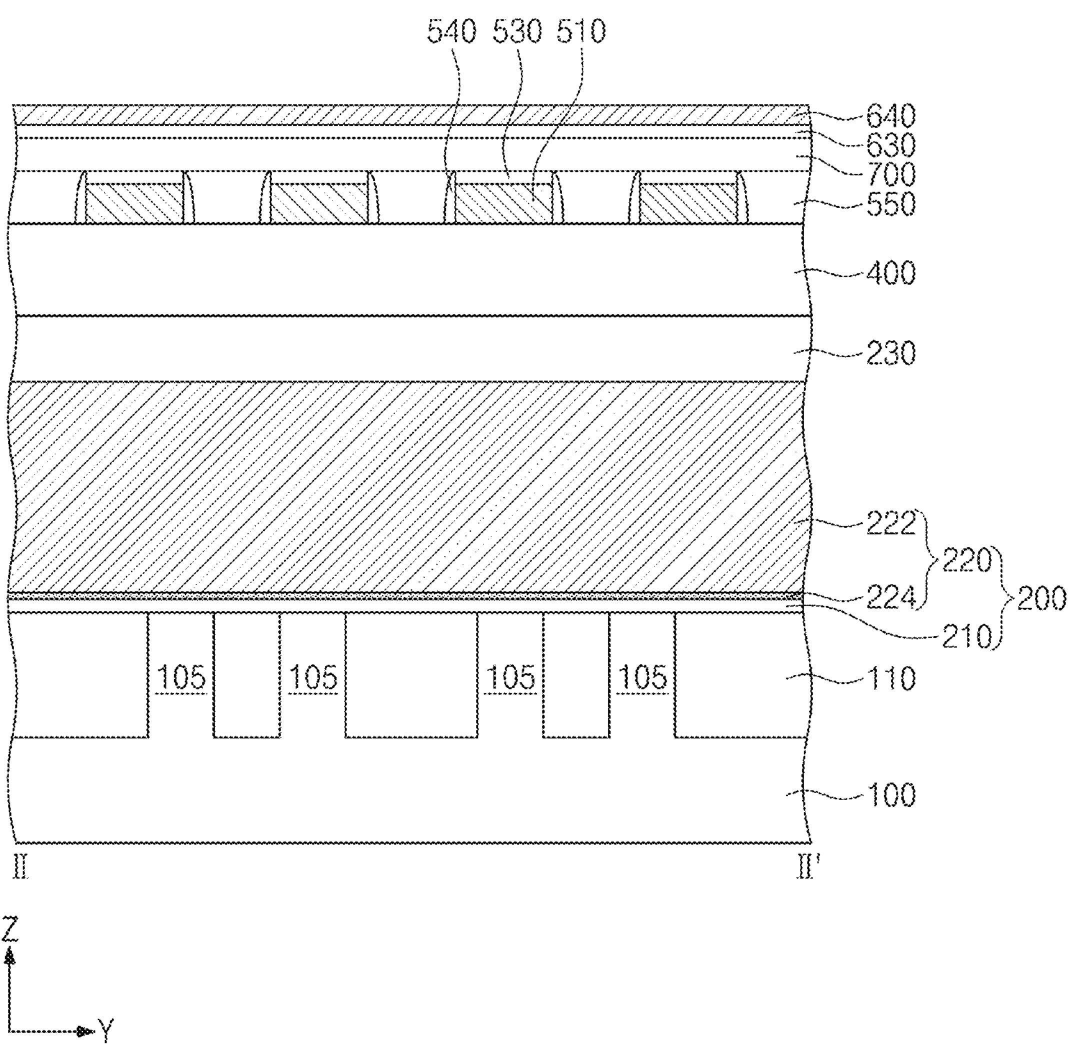

FIG. 1 is a cross-sectional view for explaining a semiconductor device according to some example embodiment of the present inventive concepts. FIGS. 2A and 2B are cross-sections for explaining a semiconductor device according to some example embodiments of the present inventive concepts, and correspond to cross-sections taken along lines I-I' and II-II' of FIG. 1, respectively.

Referring to FIGS. 1, 2A, and 2B, a substrate 100 may be provided. The substrate 100 may include a semiconductor substrate. For example, the semiconductor substrate may be a silicon (Si) substrate, a germanium (Ge) substrate, or a silicon-germanium (Si—Ge) substrate.

A first direction "X" and a second direction "Y" may be parallel to an upper surface of the substrate 100 and perpendicular to each other. A third direction "S" may be a direction parallel to the upper surface of the substrate 100 and intersecting both the first direction "X" and the second direction "Y". A fourth direction "Z" may be a direction perpendicular to all of the first to third directions "X", "Y", and "5". The cross section of FIG. 2A shows a "Z"-"S" section, and the section of FIG. 2B shows a "Z"-"Y" section.

A device isolation layer 110 may be disposed on the substrate 100 to define active regions 105. The active regions 105 may have a bar shape when viewed in a plan view. Here, the active regions 105 may have long axes in the third direction "S", respectively.

A plurality of gate lines 200 may be disposed in the substrate 100 to intersect the active regions 105 when viewed in a plan view. The gate lines 200 may be word lines. The gate lines 200 may extend in the second direction "Y" and may be disposed in parallel with one another in the first direction "X". The gate lines 200 may be buried gate lines buried in the substrate 100. The gate lines 200 may be disposed in trenches 120 of the substrate 100 extending to cross the active regions 105. Each of the gate lines 200 may partially fill each of the trenches 120. Here, an upper surface of each of the gate lines 200 may be located at a level lower than an upper surface of the substrate 100. Each of the gate lines 200 may include a conductive layer 222 and an interface layer 224. The conductive layer 222 and the interface layer 224 may constitute a conductive part 220 of each of the gate lines 200. Hereinafter, the configuration of the gate lines 200 will be described with respect to one gate line 200.

The conductive layer 222 may be disposed in the trench 120 of the substrate 100. The conductive layer 222 may partially fill the trench 120. The conductive layer 222 may include a low-resistance (low-R) material. The conductive layer 222 may include a nitride of a first metal having conductivity. For example, the first metal may include molybdenum (Mo). The conductive layer 222 may lower a resistance of the gate lines 200.

The interface layer 224 may conformally cover the trench 120 of the substrate 100. The interface layer 224 may cover sidewalls and a bottom surface of the trench 120. The interface layer 224 may be interposed between the sidewalls and bottom surfaces of the trench 120 and the conductive layer 222. That is, the interface layer 224 may separate the conductive layer 222 from the sidewalls and bottom surfaces of the trench 120, and the conductive layer 222 in the trench 120 may fill the inside of the interface layer 224. Depending on a shape of the trench 120 and a shape of the conductive layer 222, a cross-section of the interface layer 224 may have a U-shape. For example, the interface layer 224 may conformally cover a lower surface and an outer surface of the conductive layer 222. The interface layer 224 may be in contact with the lower surface and the outer surface of the conductive layer 222. The uppermost end of the interface layer 224 and the uppermost end of the conductive layer 222 may be formed at the same level. That is, an upper surface 224*a* of the interface layer 224 may be coplanar with an upper surface 222*a* of the conductive layer 222. The upper surface 224*a* of the interface layer 224 and the upper surface 222*a* of the conductive layer 222 may be formed at a level lower than the upper surface of the substrate 100. Although not shown, the upper surface 222*a* of the conductive layer 222 may be provided at a higher level than the upper surface 224*a* of the interface layer 224. That is, an upper portion of the conductive layer 222 may protrude onto the upper surface 224*a* of the interface layer 224. A thickness of the interface layer 224 may be 5 Å to 30 Å. However, the inventive concepts are not limited thereto, and the interface layer 224 may be provided to have a thickness of 30 Å or more if necessary.

The interface layer 224 may be a liner layer provided for lowering a flat band voltage of the gate lines 200. In the present specification, the flat band voltage refers to a gate voltage that causes an electric filed to become zero as an energy band becomes flat regardless of a position on a surface of a material layer. For example, a flat band voltage at a surface of the interface layer 224 may be lower than a flat band voltage at a surface of the conductive layer 222. In detail, when nitrogen (N) is injected into the molybdenum (Mo) material layer, a flat band voltage of a material layer may be lowered. That is, the interface layer 224 may be provided on the surface of the conductive layer 222, and thus the flat band voltage of the gate lines 200 may be lowered.

The interface layer 224 may include the same material as the conductive layer 222. In the present specification, the two layers including the same material may mean that the two layers consist of the same elements as each other and a composition ratio of the elements of the two layers is the same as or different from each other. The interface layer 224 may include the conductive nitride of the first metal. The first metal may include molybdenum (Mo). Here, a composition ratio of the interface layer 224 may be different from a composition ratio of the conductive layer 222. For example, a concentration of nitrogen (N) in the interface layer 224 may be greater than a concentration of nitrogen (N) in the conductive layer 222. For example, a concentration of molybdenum (Mo) in the interface layer 224 may be less than a concentration of molybdenum (Mo) in the conductive layer 222. In other words, in the conductive part 220 formed of the nitride of the first metal, the interface layer 224 may be a nitrogen-rich region, and the conductive layer 222 may be a molybdenum-rich region.

The concentration of nitrogen (N) in the interface layer 224 may decrease toward the conductive layer 222. However, the inventive concepts are not limited thereto, and the concentration of nitrogen (N) in the interface layer 224 may be substantially uniform.

The interface layer 224 and the conductive layer 222 may include the same material and may have different composition ratio from each other. Accordingly, an interfacial resistance between the interface layer 224 and the conductive layer 222 may be small. For example, there may be less lattice mismatch, which is a factor increasing the interfacial resistance, at an interface between the interface layer 224 and the conductive layer 222.

In addition, the interface layer 224 may lower the flat band voltage of each of the gate lines 200, which may mean that a work function of each of the gate lines 200 is low. For example, the flat band voltage may correspond to a difference between the work function of each of the gate lines 200 and a work function of the substrate 100. That is, the work function of each of the gate lines 200 may be reduced by the interface layer 224, and a threshold voltage of the semiconductor device may be lowered.

Furthermore, the interface layer 224 may be provided on the sidewalls of the gate lines 200, from a top of each of the gate lines 200 to first and second impurity implantation regions SD1 and SD2 to be described later. A gate induced drain leakage current (GIDL current) may be reduced.

According to some embodiments of the inventive concepts, the threshold voltage of the semiconductor device may be low while the interfacial resistance between the constituent layers 222 and 224 in each of the gate lines 200 is small. Accordingly, electrical characteristics of the semiconductor device may be improved.

Referring to FIGS. 1, 2A, and 2B, gate insulating patterns 210 may be interposed between the gate lines 200 and the active regions 105, respectively, and may be interposed between the gate lines 200 and the device isolation layer 110. The gate insulating patterns 210 may cover the sidewalls and bottom surfaces of the trenches 120. That is, the gate insulating patterns 210 may separate the gate lines 200 from the substrate 100. The gate insulating patterns 210 may include silicon oxide ($SiO_2$), silicon nitride (SiN), or silicon oxynitride (SiON).

First capping patterns 230 may be disposed on the gate lines 200, respectively. The first capping patterns 230 may be in contact with the upper surface 222*a* of the conductive layer 222 and the upper surface 224*a* of the interface layer 224. Upper surfaces of the first capping patterns 230 may be coplanar with the upper surface of the substrate 100. The gate insulating patterns 210 may extend between the first capping patterns 230 and the active regions 105 or between the first capping patterns 230 and the device isolation layer 110, respectively. Here, the gate insulating patterns 210 interposed between the first capping patterns 230 and the active regions 105 may act as a buffer which relieves stress between the active regions 105 and the first capping patterns 230. Contrary to that shown in FIG. 2A, lower surfaces of the first capping patterns 230 may be in contact with the upper surfaces of the gate insulating patterns 210 and both side surfaces of the first capping patterns 230 may be in contact with the active regions 105 or the device isolation layer 110. The first capping patterns 230 may include silicon oxide ($SiO_2$), silicon nitride (SiN), or silicon oxynitride (SiON).

The first impurity implantation region SD1 and the second impurity implantation region SD2 may be respectively disposed in the active regions 105 adjacent to both sides of each of the gate lines 200. The first impurity implantation region SD1 and the second impurity implantation region SD2 may extend inward from the surface of the substrate 100. A conductivity type of the first and second impurity implantation regions SD1 and SD2 may be different from a conductivity type of the substrate 100. For example, when the substrate 100 is P-type, the first and second impurity implanted regions SD1 and SD2 may be N-type. The first and second impurity implantation regions SD1 and SD2 may correspond to a source region or a drain region, respectively.

Subsequently, first pads 310 connected to the first impurity implantation region SD1 may be disposed on the substrate 100, and second pads 320 connected to the second impurity implantation region SD2 may be disposed on the substrate 100. The first pads 310 and the second pads 320 may include a conductive material such as polysilicon doped with impurities or metal.

A first interlayer insulating layer 400 may be disposed on the first and second pads 310 and 320. The first interlayer insulating layer 400 may include silicon oxide ($SiO_2$), silicon nitride (SiN), or silicon oxynitride (SiON).

Bit lines 510 may be disposed on the first interlayer insulating layer 400. The bit lines 510 may be provided in a second interlayer insulating layer 550 on the first interlayer insulating layer 400. The second interlayer insulating layer 550 may include silicon oxide ($SiO_2$), silicon nitride (SiN), or silicon oxynitride (SiON). The bit lines 510 may pass through the first interlayer insulating layer 400 to be connected to direct contacts 520 connected to the first pads 310, respectively. The bit lines 510 and the direct contacts 520 may include any one of a doped semiconductor material, a conductive metal nitride, a metal, and a metal-semiconductor compound. For example, the doped semiconductor material may include doped silicon (doped-Si) or doped germanium (doped-Ge). For example, the conductive metal nitride may include titanium nitride (TiN) or tantalum nitride (TaN). For example, the metal may include tungsten (W), titanium (Ti), or tantalum (Ta). For example, the metal-semiconductor compound may include tungsten silicide ($WSi_2$), cobalt silicide (CoSi), or titanium silicide (TiSi).

Second capping patterns 530 may be disposed on the bit lines 510, respectively, and both sidewalls of each of the bit lines 510 may be covered with insulating spacers 540. The second capping patterns 530 and the insulating spacers 540 may include any one of silicon oxide ($SiO_2$), silicon nitride (SiN), or silicon oxynitride (SiON).

Buried contacts 610 passing through the first and second interlayer insulating layers 400 and 550 and connected to the second pads 320, respectively, may be disposed on the substrate 100. The buried contacts 610 may include a conductive material such as doped silicon or metal.

A data storage element connected to the buried contacts 610 may be disposed on the second interlayer insulating layer 550. For example, the data storage element may be a capacitor CA. The capacitor CA may include first electrodes 620, a second electrode 640, and a dielectric layer 630 interposed between the first electrodes 620 and the second electrode 640. Each of the first electrodes 620 may have a cylindrical shape with a closed bottom. The second electrode 640 may be a common electrode that commonly covers the first electrodes 620. The first electrodes 620 and the second electrode 640 may include silicon doped with impurities, a metal, or a metal compound.

A support layer 700 may be disposed between the second electrode 640 and the second interlayer insulating layer 550. The support layer 700 may be disposed on an outer wall of the first electrode 620 to prevent the first electrode 620 from collapsing. The support layer 700 may include an insulating material. The dielectric layer 630 may extend in one direction and may be interposed between the support layer 700 and the second electrode 640.

Figure 3A:
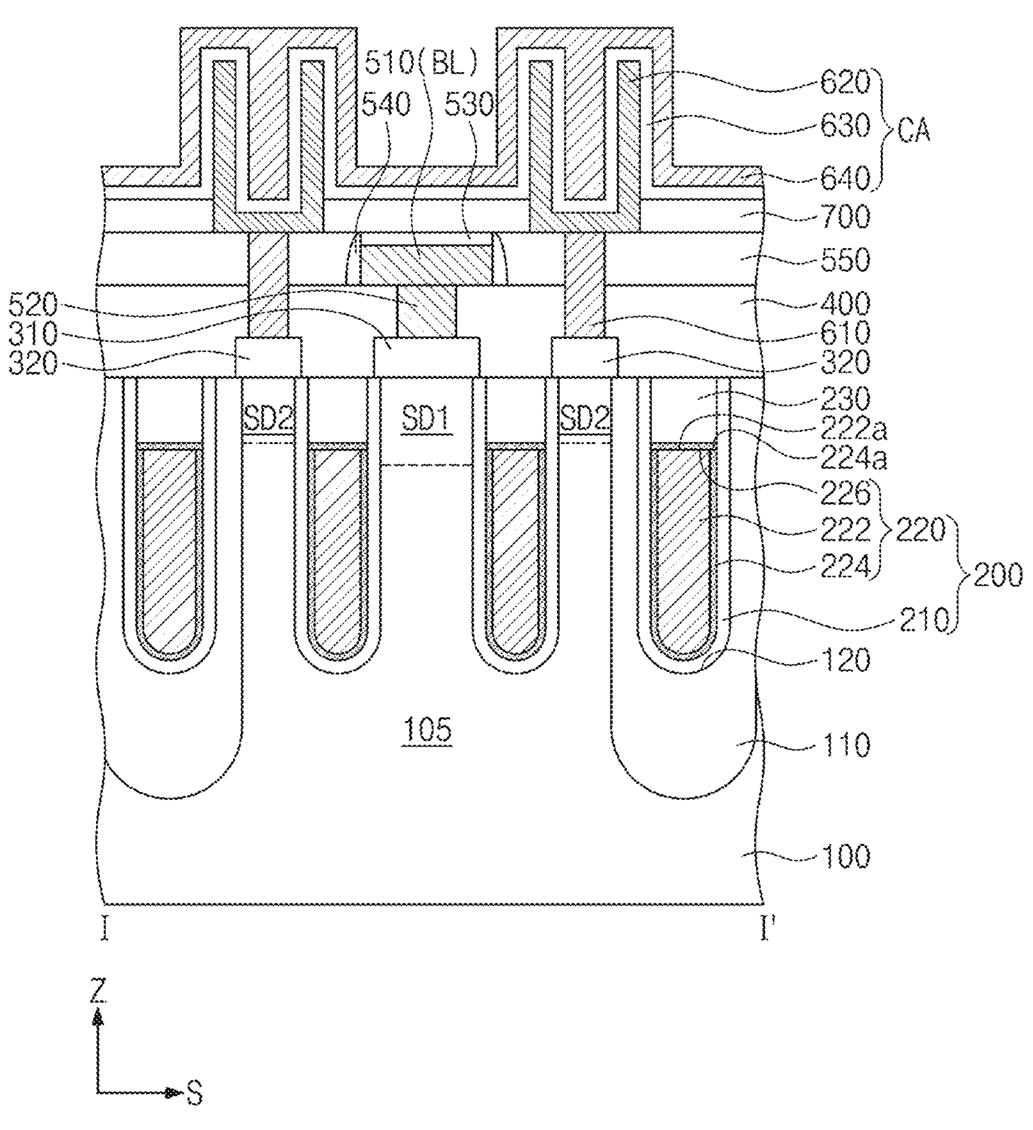
FIGS. 3A and 3B are cross-sections for explaining a semiconductor device according to some example embodiments of the present inventive concepts, and correspond to cross-sections taken along lines I-I' and II-IP of FIG. 1, respectively.
Figure 3B:
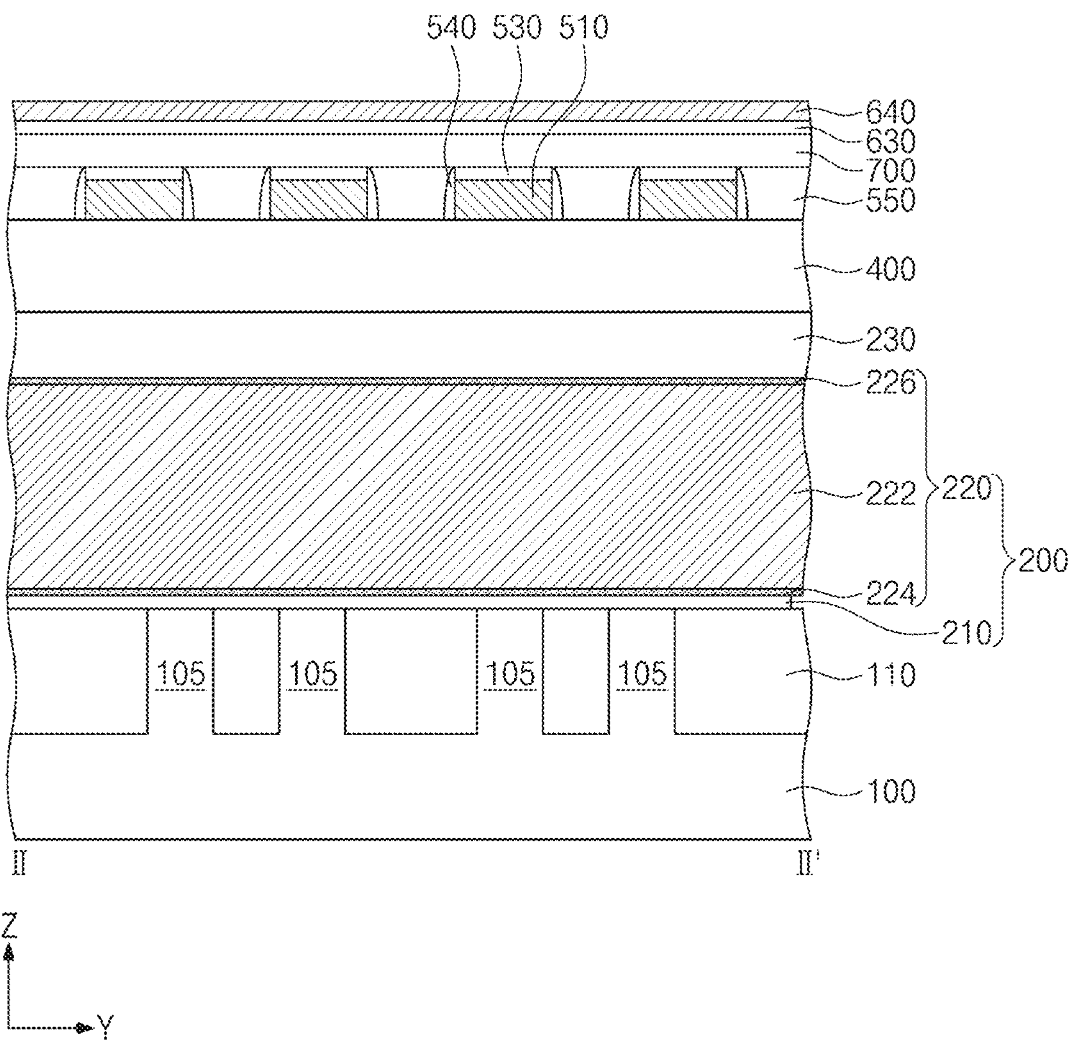

FIGS. 3A and 3B are cross-sections for explaining a semiconductor device according to some example embodiments of the present inventive concepts, and correspond to cross-sections taken along lines I-I' and II-II' of FIG. 1, respectively. In the following embodiments, components described in the embodiments of FIGS. 1, 2A, and 2B use the same reference numerals, and descriptions thereof are omitted or briefly described for convenience of description. That is, differences between the embodiments of FIGS. 1, 2A, and 2B and the following embodiments will be mainly described.

Referring to FIGS. 1, 3A, and 3B, a plurality of gate lines 200 may be disposed in a substrate 100 to intersect active regions 105 when viewed in a plan view. The gate lines 200 may be buried gate lines buried in the substrate 100. The gate lines 200 may be disposed in trenches 120 of the substrate 100 extending to cross the active regions 105, respectively. The gate lines 200 may include a conductive layer 222 and interface layers 224 and 226. The conductive layer 222 and the interface layers 224 and 226 may constitute the conductive part 220 of each of the gate lines 200. Hereinafter, the configuration of the gate lines 200 will be described with respect to one gate line 200.

The conductive layer 222 may be disposed in the trench 120 of the substrate 100. The conductive layer 222 may partially fill the trench 120. The conductive layer 222 may include a nitride of a first metal having conductivity. For example, the first metal may include molybdenum (Mo).

The interface layers 224 and 226 may include a first interface layer 224 and a second interface layer 226.

The first interface layer 224 may be substantially the same as or similar to the interface layer 224 described with reference to FIGS. 1, 2A, and 2B. The first interface layer 224 may conformally cover the trench 120 of the substrate 100. The first interface layer 224 may cover sidewalls and a bottom surface of the trench 120. The first interface layer 224 may be interposed between the sidewalls and bottom surfaces of the trench 120 and the conductive layer 222. Depending on a shape of the trench 120 and a shape of the conductive layer 222, the cross-section of the first interface layer 224 may have a U-shape. An upper surface 224*a* of the first interface layer 224 may be coplanar with an upper surface 222*a* of the conductive layer 222.

The second interface layer 226 may be disposed on the conductive layer 222 and the first interface layer 224. The second interface layer 226 may cover the upper surface 222*a* of the conductive layer 222 and the upper surface 224*a* of the first interface layer 224. The second interface layer 226 may extend from the upper surface 224*a* of the first interface layer 224 to the upper surface 222*a* of the conductive layer 222 to cover a top of the conductive layer 222. That is, the first interface layer 224 may cover the side surface of the conductive layer 222, and the second interface layer 226 may cover the upper surface 222*a* of the conductive layer 222. The upper surface 222*a* of the conductive layer 222 may not be exposed by the second interface layer 226. The second interface layer 226 may be in contact with the upper surface 224*a* of the first interface layer 224, and the second interface layer 226 and the first interface layer 224 may be connected to each other. Accordingly, the conductive layer 222 may be surrounded by the first interface layer 224 and the second interface layer 226.

The first interface layer 224 and the second interface layer 226 may include the same material as the conductive layer 222. The first interface layer 224 and the second interface layer 226 may include the conductive nitride of the first metal. For example, the first metal may include molybdenum (Mo). Here, a composition ratio of the first interface layer 224 and a composition ratio of the second interface layer 226 may be different from a composition ratio of the conductive layer 222. For example, a concentration of nitrogen (N) in the first interface layer 224 and a concentration of nitrogen (N) in the second interface layer 226 may be greater than a concentration of nitrogen (N) in the conductive layer 222. For example, a concentration of molybdenum (Mo) in the first interface layer 224 and a concentration of molybdenum (Mo) in the second interface layer 226 may be less than a concentration of molybdenum (Mo) in the conductive layer 222. In other words, in a conductive part 220 formed of the nitride of the first metal, the first interface layer 224 and the second interface layer 226 may be a nitrogen-rich region, and the conductive layer 222 may be a molybdenum-rich region. The concentration of nitrogen (N) in the first interface layer 224 and the second interface layer 226 may decrease toward the conductive layer 222. However, the inventive concepts are not limited thereto, and the concentration of nitrogen (N) in the first interface layer 224 and the second interface layer 226 may be substantially uniform.

When the first interface layer 224 and the second interface layer 226 are formed of the same material and have the same composition ratio as each other, the first interface layer 224 and the second interface layer 226 have a structure connected to each other, and an interface between the first interface layer 224 and the second interface layer 226 may not appear visually. That is, the first interface layer 224 and the second interface layer 226 may be integrally formed. Alternatively, depending on the composition ratio of the first interface layer 224 and the second interface layer 226, the interface between the first interface layer 224 and the second interface layer 226 may appear visually.

The first interface layer 224 and the second interface layer 226 may lower a flat band voltage of each of the gate lines 200, which means that a work function of each of the gate lines 200 is low. The second interface layer 226 having a low work function may cover the entire upper portion of the conductive part 220, and accordingly, the work function of the upper portion of each of the gate lines 200 may be further lowered. That is, a gate induced leakage drain (GIDL) current generated from upper portions of the gate lines 200 to impurity implantation regions SD1 and SD2 may be reduced.

Gate insulating patterns 210 may be interposed between the gate lines 200 and the active regions 105, and may also be interposed between the gate lines 200 and the device isolation layer 110. The gate insulating patterns 210 may separate the gate lines 200 from the substrate 100, respectively.

First capping patterns 230 may be disposed on the gate lines 200. The first capping patterns 230 may be in contact with the upper surface of the second interface layer 226. Upper surfaces of the first capping patterns 230 may be coplanar with the upper surface of the substrate 100. The gate insulating patterns 210 may extend between the first capping patterns 230 and the active regions 105 or between the first capping patterns 230 and the device isolation layer 110, respectively. Contrary to that shown in FIG. 3A, lower surfaces of the first capping patterns 230 may be in contact with the upper surfaces of the gate insulating patterns 210 and the upper surface of the second interface layer 226, and both side surfaces of each of the first capping patterns 230 may be in contact with the active regions 105 or the device isolation layer 110. The first capping patterns 230 may include silicon oxide ($SiO_2$), silicon nitride (SiN), or silicon oxynitride (SiON).

Figure 4:
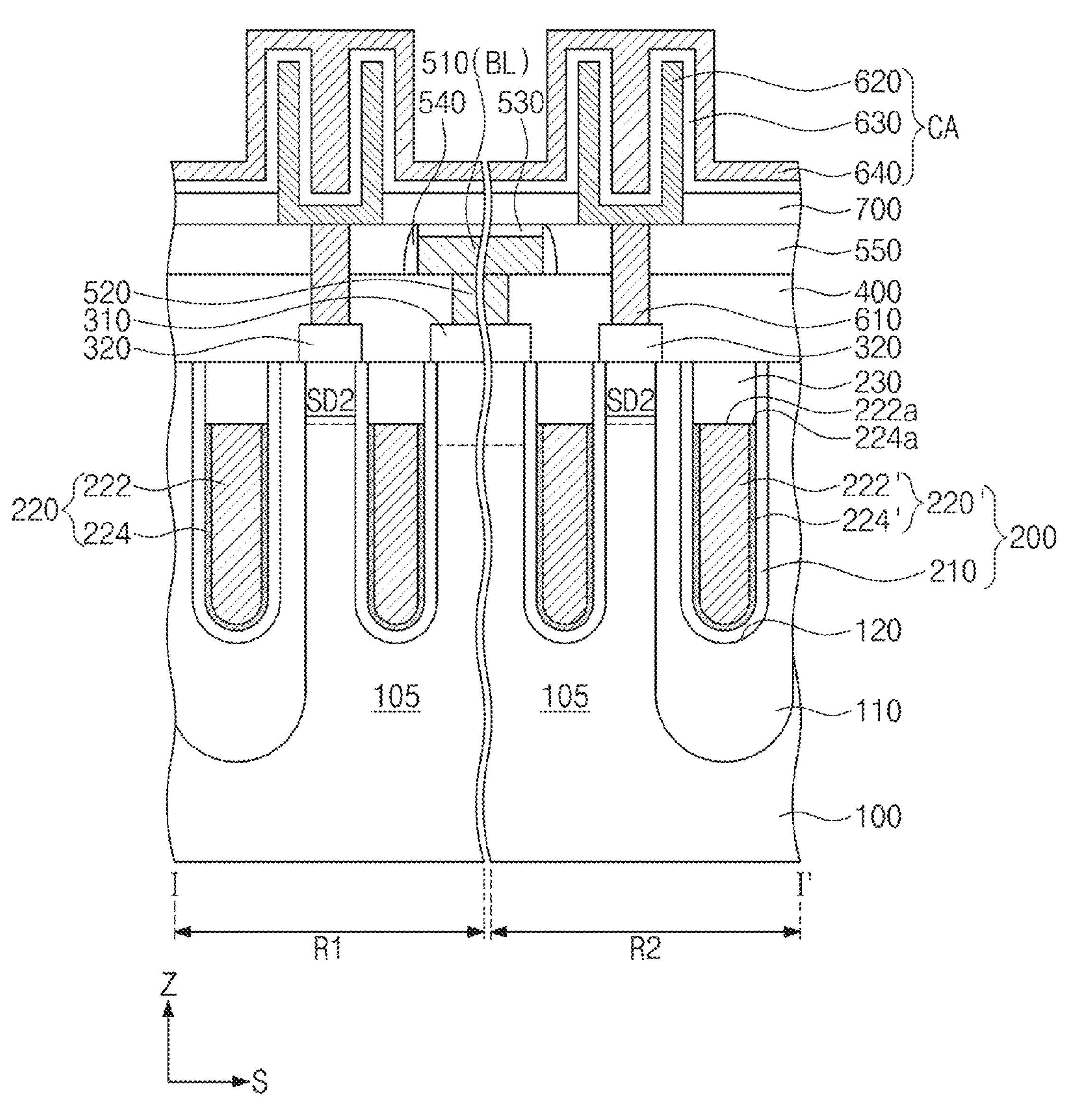
FIG. 4 is a cross-sectional view for explaining a semiconductor device according to some example embodiments of the present inventive concepts.

FIG. 4 is a cross-sectional view for explaining a semiconductor device according to some example embodiments of the present inventive concepts.

Referring to FIG. 4, a substrate 100 may be provided. The substrate 100 may have a first region R1 and a second region R2. The first region R1 and the second region R2 may be regions on the substrate 100 on which transistors are provided. For example, the transistors provided on the first region R1 and the second region R2 may have the same or similar structure and may have different electrical characteristics. This will be described in more detail along with the description of gate lines 200 later.

A device isolation layer 110 may be disposed on the substrate 100 to define active regions 105. Each of the active regions 105 may have a bar shape when viewed in a plan view.

A plurality of gate lines 200 may be disposed in the substrate 100 to intersect the active regions 105 when viewed in a plan view. The gate lines 200 may extend in a second direction "Y" and may be disposed in parallel in a first direction "X". The gate lines 200 may be buried gate lines buried in the substrate 100. The gate lines 200 may be disposed in trenches 120 of the substrate 100 extending to cross the active regions 105. The gate lines 200 on the first region R1 may include a first conductive layer 222 and a first interface layer 224. The first conductive layer 222 and the first interface layer 224 may constitute a first conductive part 220. The gate lines 200 on the second region R2 may include a second conductive layer 222' and a third interface layer 224'. The second conductive layer 222' and the third interface layer 224' may constitute a second conductive part 220'.

The configuration of the first conductive part 220 may be substantially the same as or similar to the configuration of the conductive part 220 described with reference to FIGS. 2A and 2B. For example, the first conductive layer 222 may be disposed in the trench 120 of the substrate 100 on the first region R1. The first conductive layer 222 may partially fill the trench 120. The first conductive layer 222 may include a nitride of a first metal having conductivity. For example, the first metal may include molybdenum (Mo). The first interface layer 224 may be interposed between sidewalls and bottom surfaces of the trench 120 in the first region R1 and the first conductive layer 222. The first interface layer 224 may conformally cover a lower surface and an outer surface of the first conductive layer 222. The uppermost end of the first interface layer 224 and the uppermost end of the first conductive layer 222 may be formed at the same level. An upper surface of the first interface layer 224 and an upper surface of the first conductive layer 222 may be formed at a level lower than an upper surface of the substrate 100. The first interface layer 224 may include the same material as the first conductive layer 222. The first interface layer 224 may include the conductive nitride of the first metal. A composition ratio of the first interface layer 224 may be different from a composition ratio of the first conductive layer 222. For example, a concentration of nitrogen (N) in the first interface layer 224 may be greater than a concentration of nitrogen (N) in the first conductive layer 222. For example, a concentration of molybdenum (Mo) in the first interface layer 224 may be less than a concentration of molybdenum (Mo) in the first conductive layer 222.

A configuration of the second conductive part 220' may be similar to the configuration of the first conductive part 220. For example, the second conductive layer 222' may be disposed in the trench 120 of the substrate 100 on the second region R2. The second conductive layer 222' may partially fill the trench 120. The second conductive layer 222' may include a nitride of the first metal having conductivity. For example, the first metal may include molybdenum (Mo). The third interface layer 224' may be interposed between the sidewalls and bottom surfaces of the trench 120 in the second region R2 and the second conductive layer 222'. The third interface layer 224' may conformally cover a lower surface and an outer surface of the second conductive layer 222'. The uppermost end of the third interface layer 224' and the uppermost end of the second conductive layer 222' may be formed at the same level. An upper surface of the third interface layer 224' and an upper surface of the second conductive layer 222' may be formed at a level lower than the upper surface of the substrate 100. The third interface layer 224' may include the same material as the second conductive layer 222'. The third interface layer 224' may include the conductive nitride of the first metal. A composition ratio of the third interface layer 224' may be different from a composition ratio of the second conductive layer 222'. For example, a concentration of nitrogen (N) in the third interface layer 224' may be greater than a concentration of nitrogen (N) in the second conductive layer 222'. For example, a concentration of molybdenum (Mo) in the third interface layer 224' may be less than a concentration of molybdenum (Mo) in the second conductive layer 222'.

A thickness of the first interface layer 224 and a thickness of the third interface layer 224' may be different from each other. For example, the thickness of the first interface layer 224 may be greater than the thickness of the third interface layer 224'. The thickness of the first interface layer 224 and the thickness of the third interface layer 224' may be 5 Å to 30 Å, respectively.

The first interface layer 224 and the third interface layer 224' may be liner layers provided for lowering a flat band voltage of each of the gate lines 200. Because the thickness of the first interface layer 224 and the thickness of the third interface layer 224' are different from each other, work functions of the gate lines 200 on the first region R1 and work functions of the gate lines 220 on the second region R2 may be different from each other. That is, transistors having different threshold voltages may be provided on the first region R1 and the second region R2, respectively.

Alternatively, the thickness of the first interface layer 224 and the thickness of the third interface layer 224' may be the same. Here, the nitrogen concentration in the first interface layer 224 and the nitrogen concentration in the third interface layer 224' may be different from each other. For example, the nitrogen concentration in the first interface layer 224 may be greater than the nitrogen concentration in the third interface layer 224'. Accordingly, the work functions of the gate lines 200 in the first region R1 may be smaller than the work functions of the gate lines 200 in the second region R2. That is, transistors having different threshold voltages may be provided on the first region R1 and the second region R2, respectively.

FIGS. 5A to 10A are cross-sections for explaining a method of fabricating a semiconductor device according to some example embodiments of the present inventive concepts, and correspond to cross-sections taken along line I-I' of FIG. 1. FIGS. 5B to 10B are cross-sections for explaining a method of fabricating a semiconductor device according to some example embodiments of the present inventive concepts, and correspond to cross-sections taken along line II-II' of FIG. 1. FIG. 8C is an enlarged view of area "A" of FIG. 8A.

Figure 5A:
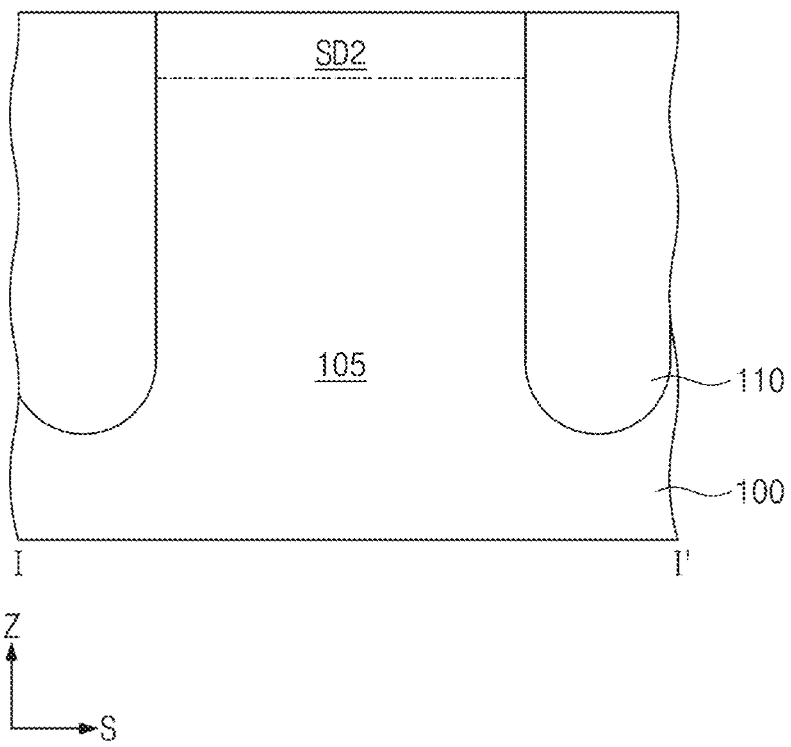
Figure 5B:
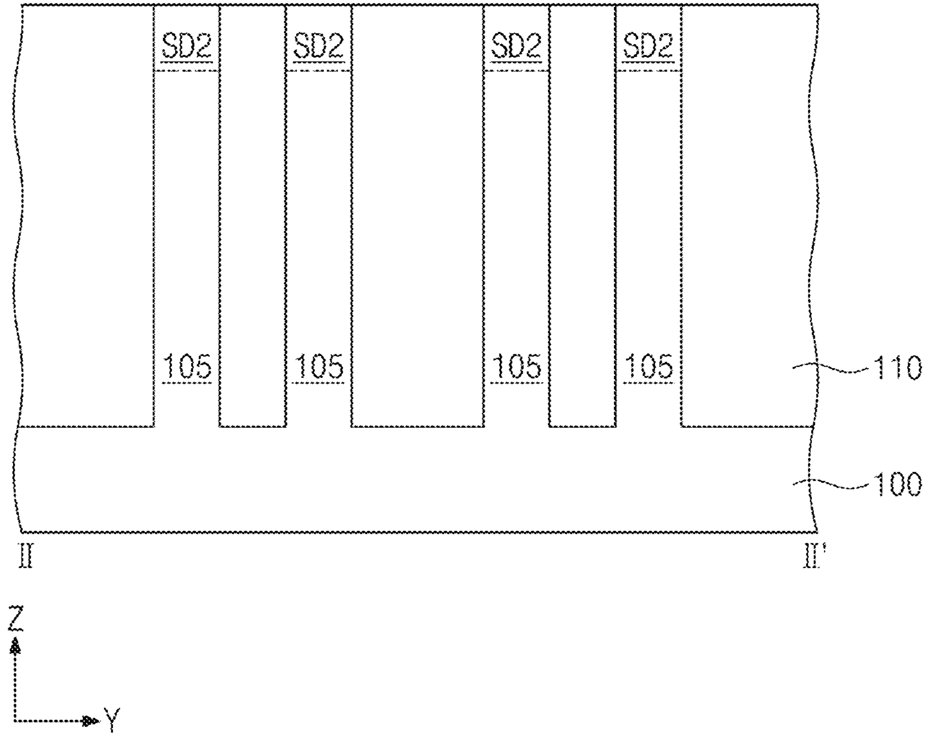

Referring to FIGS. 1, 5A, and 5B, a device isolation layer 110 defining active regions 105 may be formed on a substrate 100. For example, the device isolation layer 110 may be formed using a shallow trench isolation (STI) method. The device isolation layer 110 may include silicon oxide ($SiO_2$), silicon nitride (SiN), or silicon oxynitride (SiON). The device isolation layer 110 may be formed to extend into the substrate 100.

Second impurity implantation regions SD2 may be formed in the active regions 105 of the substrate 100. The second impurity implantation regions SD2 may be formed by an ion implantation process. For example, the second impurity implantation regions SD2 may be regions doped with an N-type dopant.

Figure 6A:
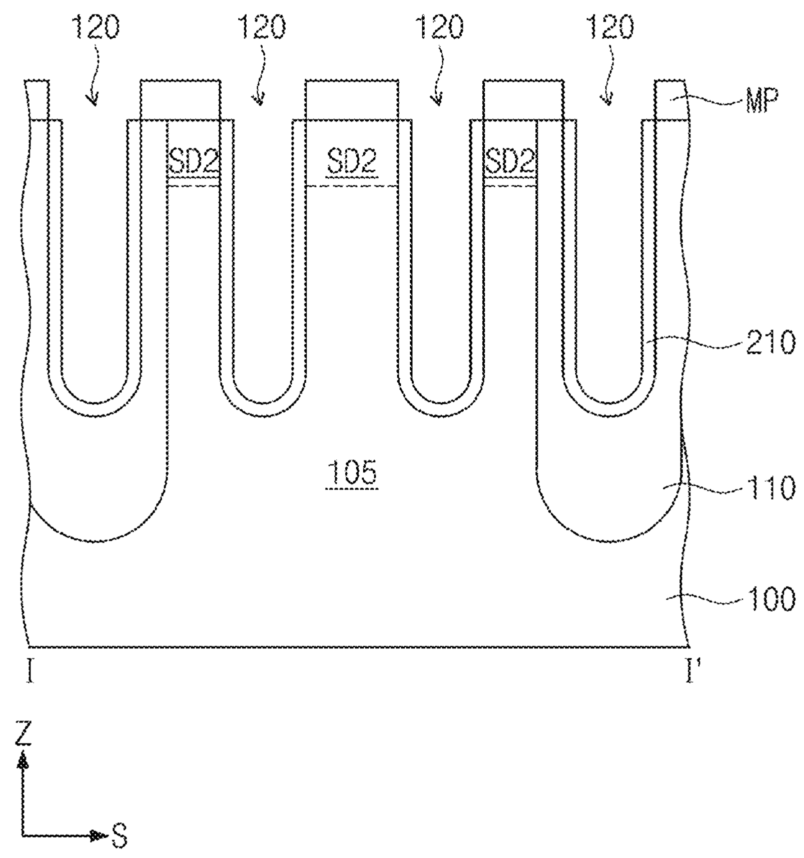
Figure 6B:
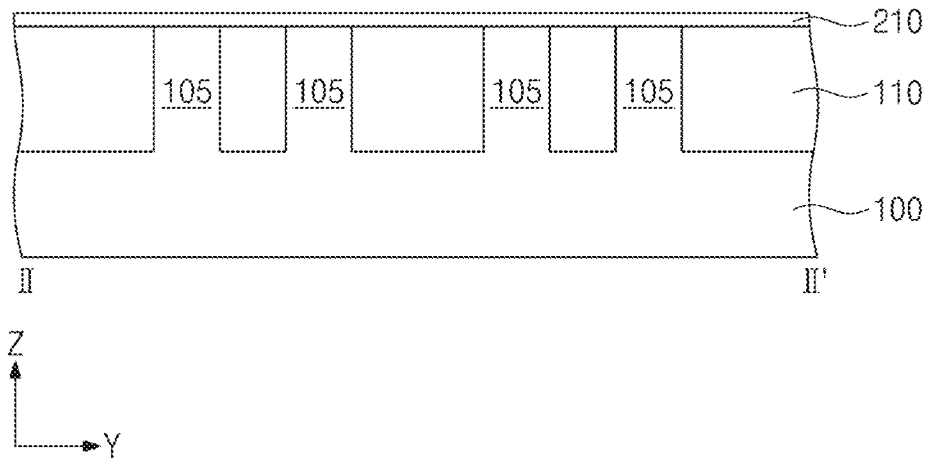

Referring to FIGS. 1, 6A, and 6B, mask patterns MP may be formed on the substrate 100. The mask patterns MP may be formed to have openings defining regions in which gate lines 200 (refer to FIGS. 2A and 2B) to be described below are disposed. The mask patterns MP may be a hard mask pattern such as silicon nitride (SiN) or a photo resist pattern. Line-shaped trenches 120 extending in a second direction "Y" may be formed by etching the substrate 100 and the device isolation layer 110, using the mask patterns MP as an etching mask. Bottom surfaces of the trenches 120 may expose the device isolation layer 110 and the active regions 105.

Subsequently, gate insulating patterns 210 may be formed in the trenches 120, respectively. The gate insulating patterns 210 may be formed by a thermal oxidation process, atomic layer deposition (ALD), or chemical vapor deposition (CVD). For example, the gate insulating patterns 210 may be formed of silicon oxide ($SiO_2$) formed on the exposed surface of the substrate 100 by a thermal oxidation process. Here, the gate insulating patterns 210 may be formed on sidewalls and bottom surfaces of the trenches 120. Here, the gate insulating patterns 210 may conformally cover the inside of the trenches 120 (i.e., sidewalls and bottom surfaces of the trenches 120). Alternatively, the gate insulating patterns 210 may include silicon oxide ($SiO_2$), silicon nitride (SiN), silicon oxynitride (SiON), or high dielectric material which is formed by a LPCVD process, a PECVD process, a UHV-CVD process, or an ALD process. Here, the gate insulating patterns 210 may conformally cover the inside of the trenches 120 and the mask patterns MP.

Figure 7A:
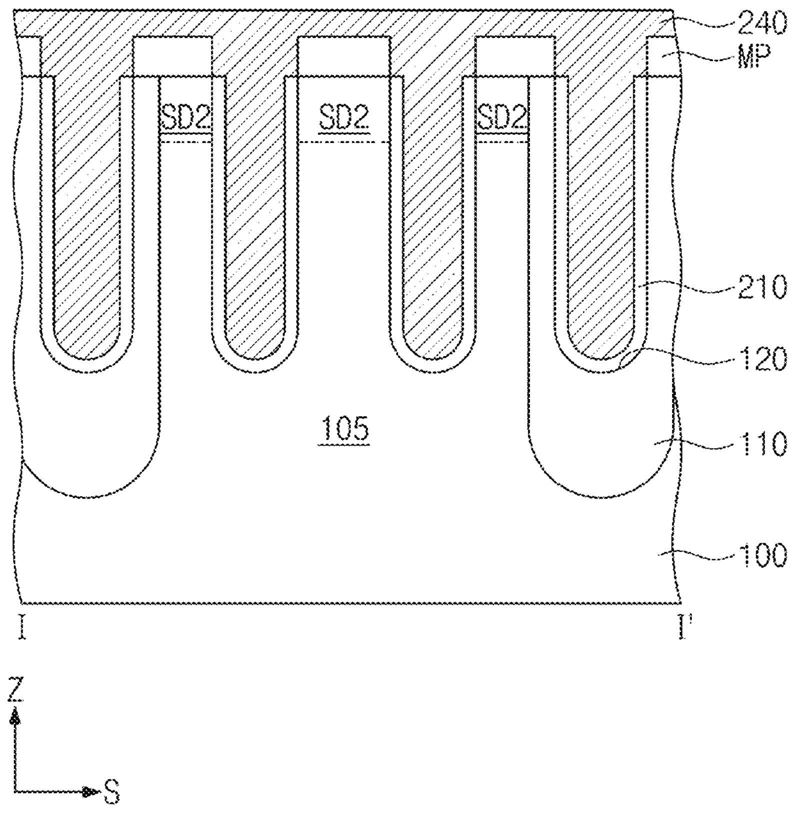
Figure 7B:
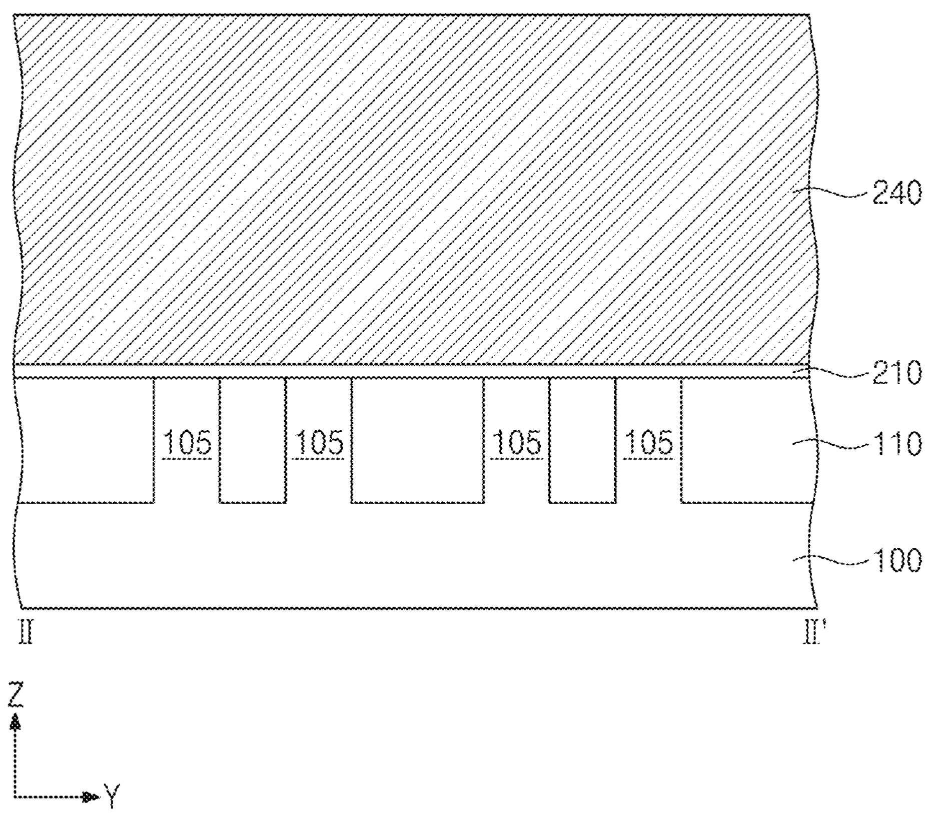

Referring to FIGS. 1, 7A, and 7B, a preliminary conductive layer 240 may be formed on the substrate 100. In detail, the preliminary conductive layer 240 may be formed by depositing a conductive material on the entire surface of the substrate 100. Here, the conductive material may fill the trenches 120. In detail, the preliminary conductive layer 240 may be formed using a first precursor material including molybdenum (Mo) and a second precursor material including nitrogen. For example, the first precursor material may include $Mo_xO_yCl_z$, and the second precursor material may include ammonia ($NH_3$). The first precursor material and the second precursor material may react to form $Mo_aO_bN_c$, $N_d$, $H_2O$, and HCl. The deposition process of the conductive material may be performed at a temperature of 550 degrees or more. As the process temperature of the deposition process increases, "b" and "c" of $Mo_aO_bN_c$ may decrease, and "d" of $N_d$ may increase. When the process temperature of the deposition process is lower than 550 degrees, a nitrogen concentration in the preliminary conductive layer 240 may be low, and the preliminary interface layer 242 having a high nitrogen concentration may not be formed in a process to be described later. The depositing of the conductive material may be performed using various deposition processes, such as a chemical vapor deposition (CVD) process or atomic layer deposition (ALD). The conductive material may include a low resistance (low-R) material. The conductive material may include a nitride of a first metal having conductivity. For example, the conductive material may include molybdenum (Mo).

Referring to FIGS. 1 and 8A to 8C, a preliminary interface layer 242 may be formed by performing a first process. For example, the preliminary interface layer 242 may be formed by diffusing nitrogen atoms in the preliminary conductive layer 240 into a part of the preliminary conductive layer 240. Here, the part of the preliminary conductive layer 240 means a part adjacent to outer surfaces of the preliminary conductive layer 240. For example, the part may be a part of the preliminary conductive layer 240 adjacent to an interface between the preliminary conductive layer 240 and the gate insulating patterns 210. That is, the preliminary interface layer 242 may be interposed between the preliminary conductive layer 240 and the trenches 120 or the preliminary conductive layer 240 and the gate insulating patterns 210. A thickness of the preliminary interface layer 242 may be 5 Å to 30 Å.

Figure 8A:
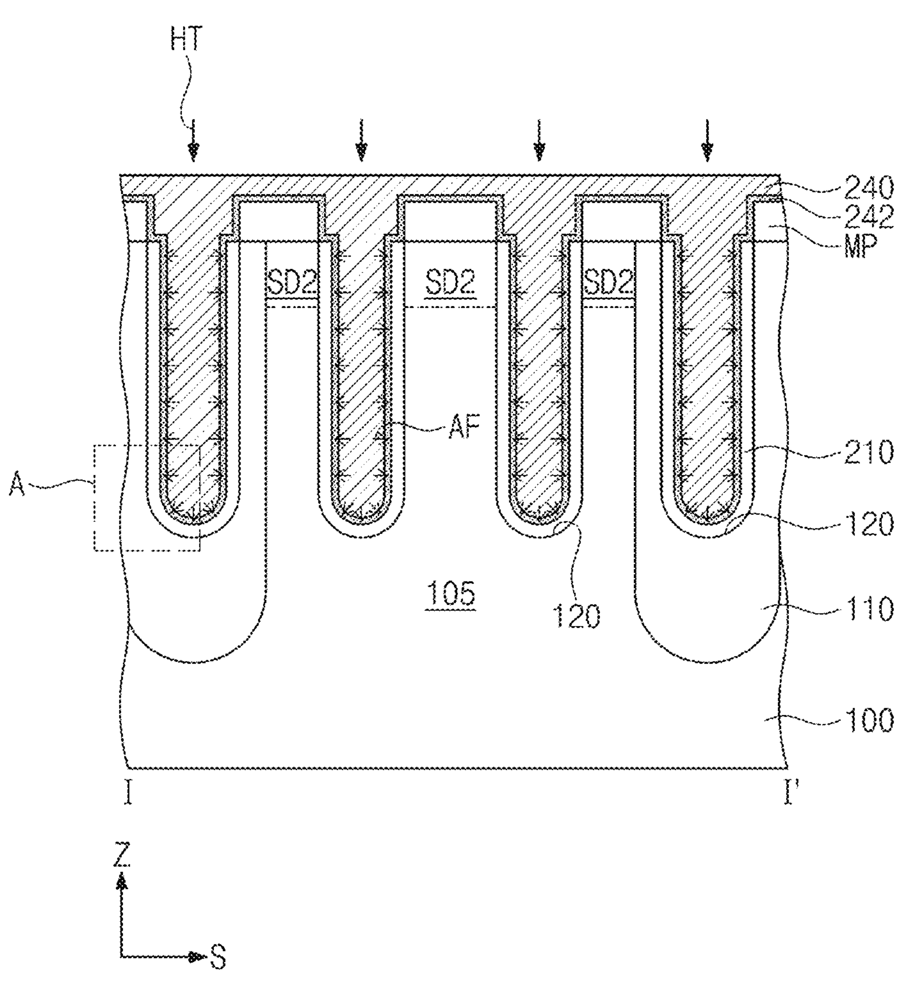
Figure 8B:
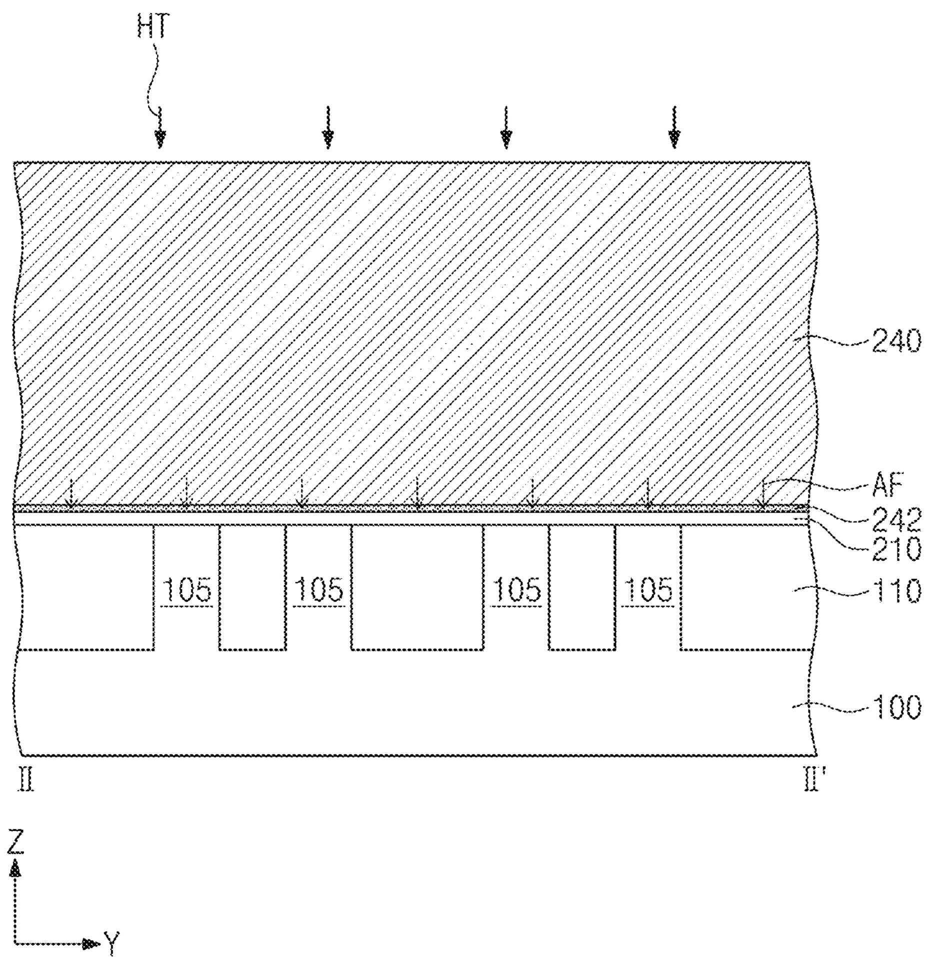
Figure 8C:
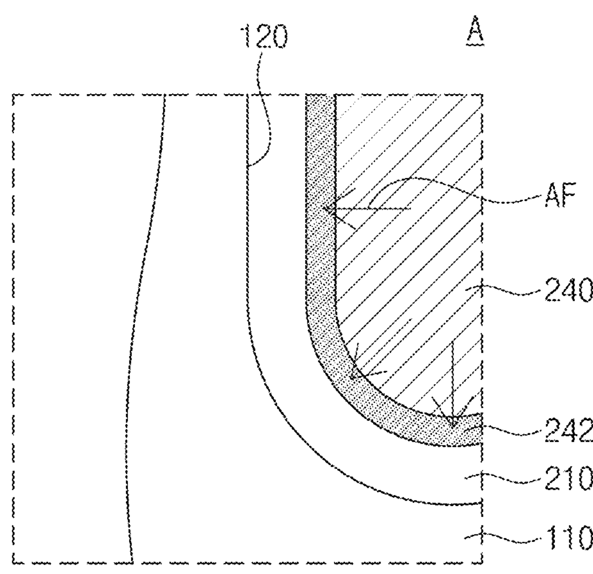
FIG. 8C is an enlarged view of area "A" of FIG. 8A.

To describe the first process in more detail, the nitrogen atoms of the preliminary conductive layer 240 may be diffused into the outer portion of the preliminary conductive layer 240 along an arrow AF of FIG. 8C by the first process. The outer portion of the preliminary conductive layer 240 having an increased nitrogen concentration may constitute the preliminary interface layer 242. A nitrogen concentration inside the preliminary conductive layer 240 may be lowered. Accordingly, the nitrogen concentration of the preliminary interface layer 242 may be higher than the nitrogen concentration of the preliminary conductive layer 240. Along the diffusion direction AF of the nitrogen atoms, the nitrogen concentration in the preliminary conductive layer 240 may decrease from the outer surface and lower surfaces of the preliminary conductive layer 240 toward the inside of the preliminary conductive layer 240. Alternatively, the nitrogen concentration in the preliminary conductive layer 240 may be substantially uniform in the preliminary conductive layer 240. The first process may include a heat treatment process. That is, the nitrogen atoms in the preliminary conductive layer 240 may be diffused by heat HT provided from the outside. The heat treatment process may include a rapid thermal annealing (RTA) process.

Figure 9A:
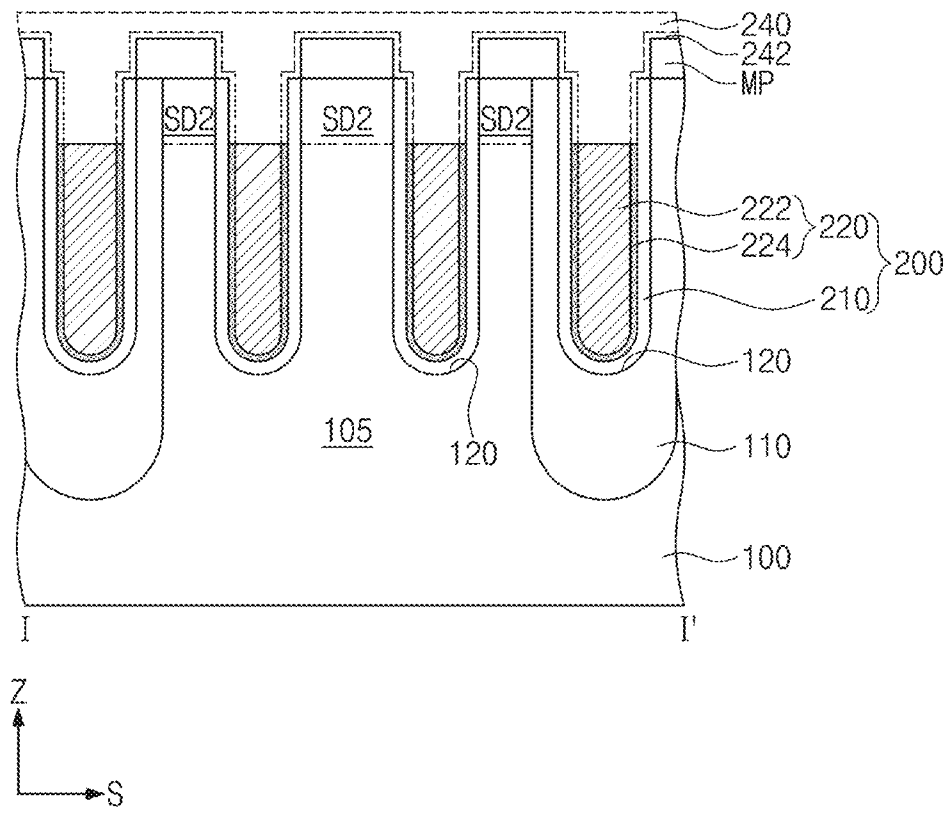
Figure 9B:
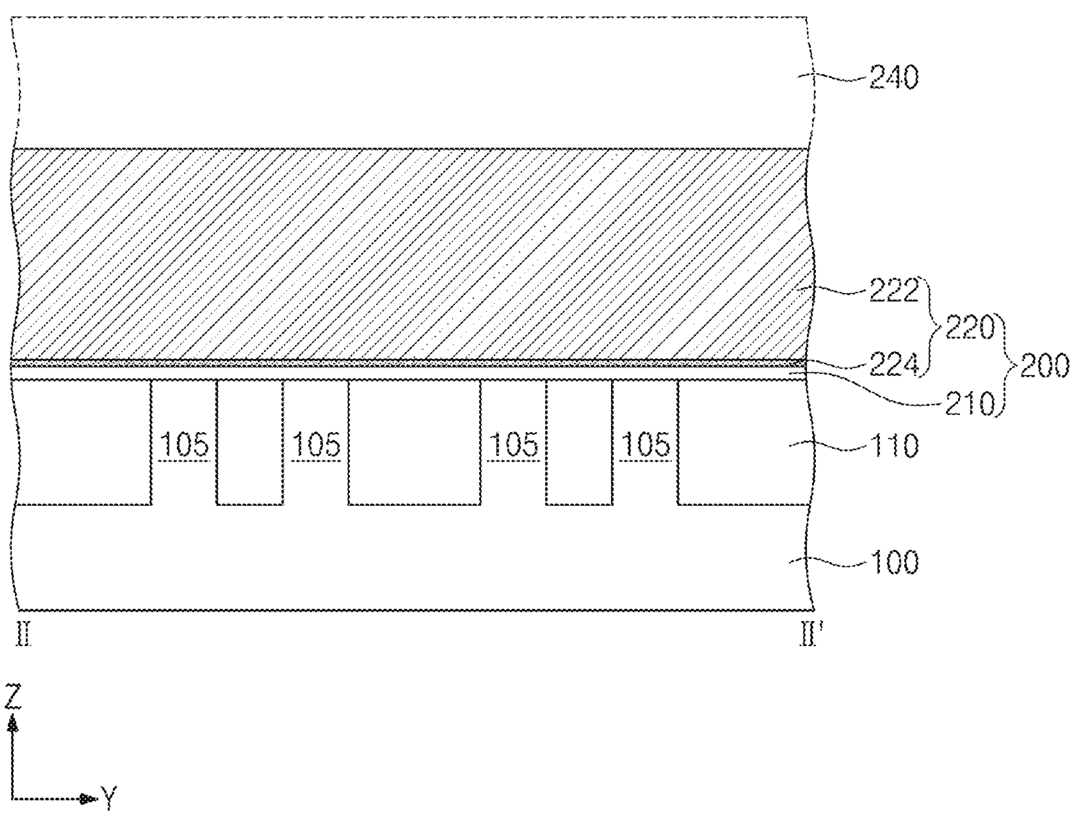

Referring to FIGS. 1, 9A, and 9B, an etch back process may be performed on the preliminary conductive layer 240 and the preliminary interface layer 242. For example, a conductive layer 222 and an interface layer 224 may be formed by etching the preliminary conductive layer 240 and the preliminary interface layer 242. During the etching process, the conductive layer 222 and the interface layer 224 may be etched together. For example, the conductive layer 222 and the interface layer 224 may be formed of the same material, and an etchant for etching the conductive layer 222 and the interface layer 224 may be the same. The etching process may be continued until the conductive layer 222 and the interface layer 224 remain in the trenches 120 to a desired thickness. Here, an upper surface of the interface layer 224 may be formed to be at the same level as an upper surface of the conductive layer 222. Alternatively, the upper surface of the interface layer 224 and the upper surface of the conductive layer 222 may be disposed at different heights depending on difference in etch rates between the conductive layer 222 and the interface layer 224. For example, the upper surface of the interface layer 224 may be disposed at a level lower than the upper surface of the conductive layer 222.

Thereafter, the mask patterns MP may be removed. As the mask patterns MP are removed, the upper surfaces of the device isolation layer 110 and the active regions 105 may be exposed.

Figure 10A:
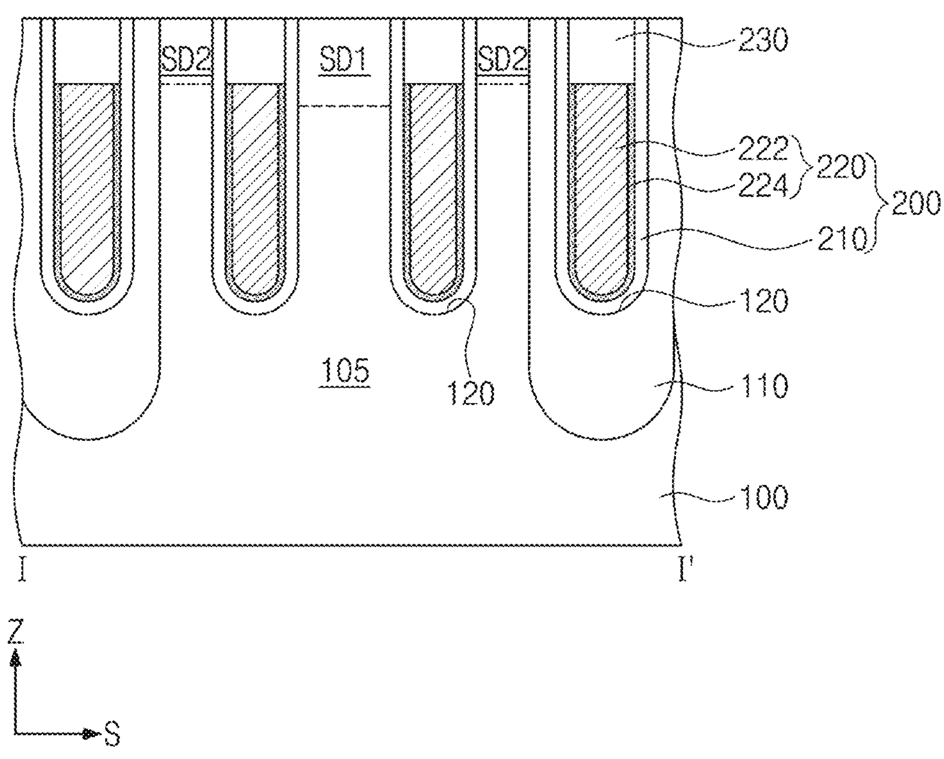
Figure 10B:
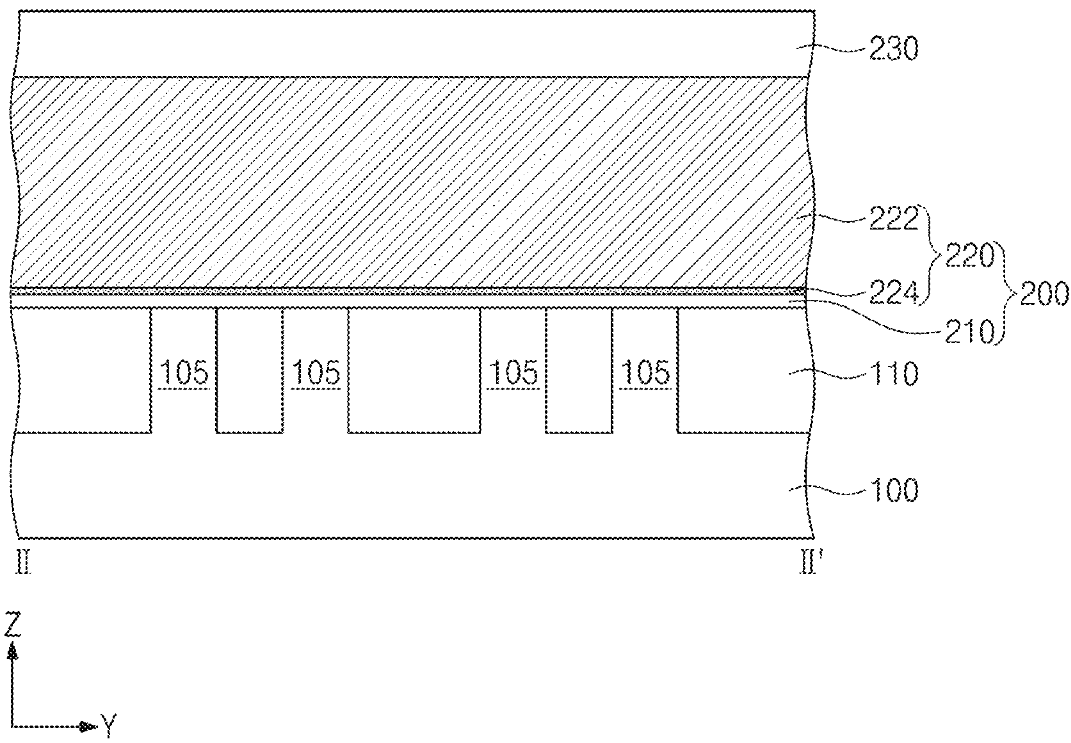

Referring to FIGS. 1, 10A, and 10B, first capping patterns 230 may be formed in the trenches 120. For example, the first capping patterns 230 may be formed by forming a capping layer on the entire surface of the substrate 100 and then performing a planarization process or the like. The first capping patterns 230 may include any one of oxide ($SiO_2$), silicon nitride (SiN), or silicon oxynitride (SiON).

An ion implantation process may be performed on the substrate 100, and thus a first impurity implantation region SD1 may be formed in regions between two adjacent gate lines 200. The first impurity implantation region SD1 may be doped with the same N-type impurity as the second impurity implantation region SD2. The first impurity implantation region SD1 may extend deeper into the substrate 100 than the second impurity implantation region SD2.

Referring back to FIGS. 1, 2A, and 2B, a polysilicon layer doped with impurities, a silicon single crystal layer doped with impurities, or a conductive layer may be formed on the substrate 100 and may be patterned, thereby forming a first pads 310 and second pads 320. The first pads 310 may be connected to the first impurity implantation region SD1, and the second pads 320 may be connected to the second impurity implantation region SD2, respectively. When the first pads 310 and the second pads 320 include a polysilicon layer doped with impurities or a silicon single crystal layer, the first pads 310 and the second pads 320 may be doped with the same type of impurities as those of the first and second impurity implanted regions SD1 and SD2.

A first interlayer insulating layer 400 may be formed on the first and second pads 310 and 320. The first interlayer insulating layer 400 may be formed using a chemical vapor deposition (CVD) process or the like. The first interlayer insulating layer 400 may include oxide ($SiO_2$), silicon nitride (SiN), or silicon oxynitride (SiON). The first interlayer insulating layer 400 may be partially patterned to form contact holes defining regions in which direct contacts 520 are to be formed. A conductive material filling the contact holes may be coated on the first interlayer insulating layer 400, and a capping layer may be formed thereon. For example, the conductive material may include a conductive material such as a metal or a doped semiconductor. For example, the capping layer may include any one of oxide ($SiO_2$), silicon nitride (SiN), or silicon oxynitride (SiON). A bit line 510 and second capping patterns 530 disposed thereon may be formed by patterning the capping layer and the conductive material. Direct contacts 520 may be formed in the contact holes. Insulating spacers 540 covering sidewalls of the bit line 510 may be formed by conformally depositing an insulating spacer layer on the first interlayer insulating layer 400 and performing anisotropic etching. The insulating spacers 540 may include any one of oxide ($SiO_2$), silicon nitride (SiN), or silicon oxynitride (SiON).

A second interlayer insulating layer 550 may be formed on the first interlayer insulating layer 400 and may perform a planarization process to expose upper surfaces of the second capping patterns 530. Thereafter, buried contacts 610 connected to the second pads 320 may be formed through the second interlayer insulating layer 550 and the first interlayer insulating layer 400. The buried contacts 610 may include a conductive material such as doped silicon or metal. A support layer 700 may be formed on the second interlayer insulating layer 550. The support layer 700 may include any one of oxide ($SiO_2$), silicon nitride (SiN), or silicon oxynitride (SiON). The support layer 700 may be formed using various deposition processes, such as a chemical vapor deposition (CVD) process or atomic layer deposition (ALD). A first electrode 620 connected to the buried contacts 610 may be formed through the support layer 700. The first electrode 620 may be formed in a cylindrical shape with a closed bottom. A dielectric layer 630 covering the first electrode 620 may be formed, and a second electrode 640 commonly covering the first electrode 620, and thus a capacitor CA may be formed. The first electrode 620 and the second electrode 640 may include silicon doped with impurities, a metal, or a metal compound. Therefore, the semiconductor device described with reference to FIGS. 2A and 2B may be formed.

FIGS. 11A to 13A are cross-sections for explaining a method of fabricating a semiconductor device according to some example embodiments of the present inventive concepts, and correspond to cross-sections taken along line I-I' of FIG. 1. FIGS. 11B to 13B are cross-sections for explaining a method of fabricating a semiconductor device according to some example embodiments of the present inventive concepts, and correspond to cross-sections taken along line II-II' of FIG. 1.

Figure 11A:
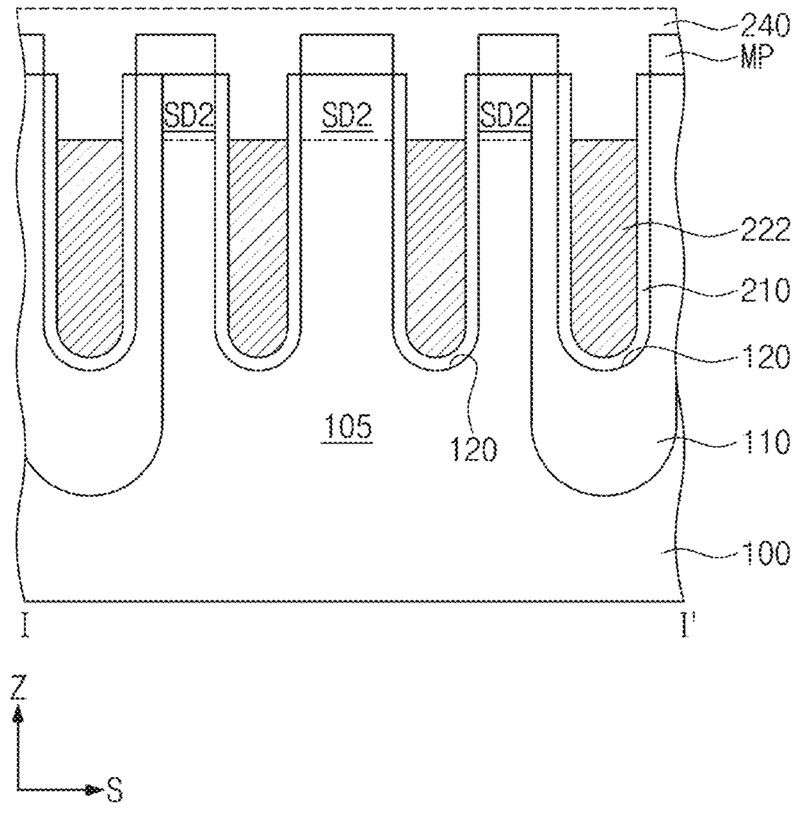
Figure 11B:
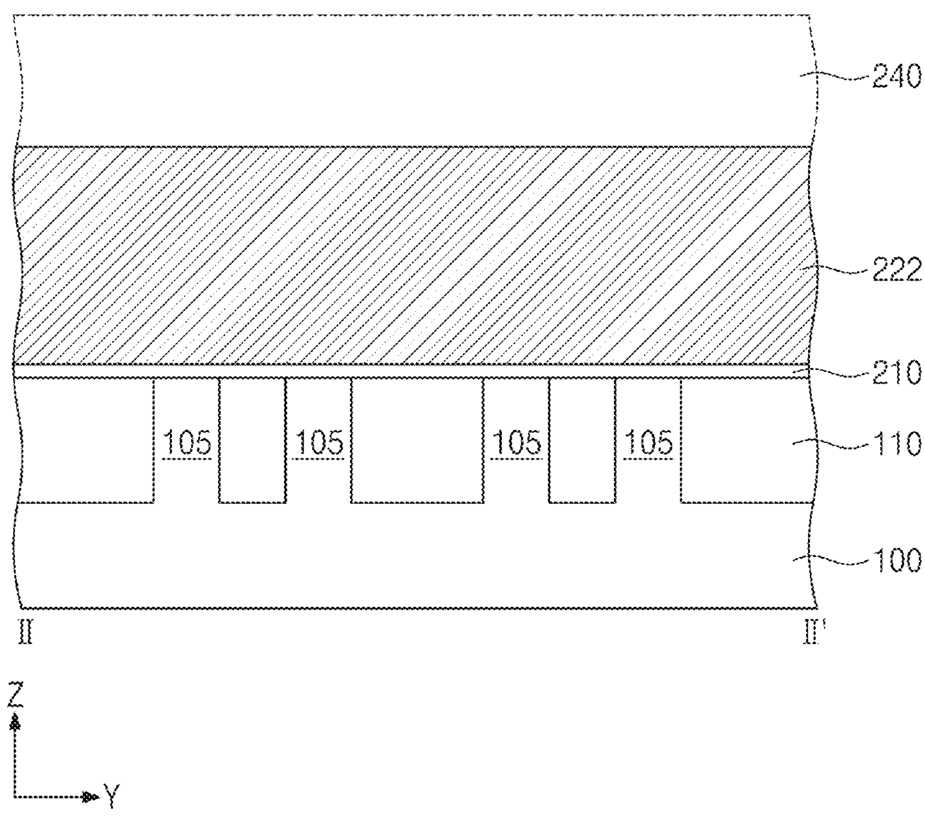

Referring to FIGS. 1, 11A, and 11B, an etch back process may be performed on a preliminary conductive layer 240 in a resultant of FIG. 7. For example, a conductive layer 222 may be formed by etching the preliminary conductive layer 240. The etching process may continue until the conductive layer 222 remains in the trenches 120 to a desired thickness. After the etching process, an upper surface of the conductive layer 222 may be positioned at a level lower than an upper surface of a substrate 100.

Figure 12A:
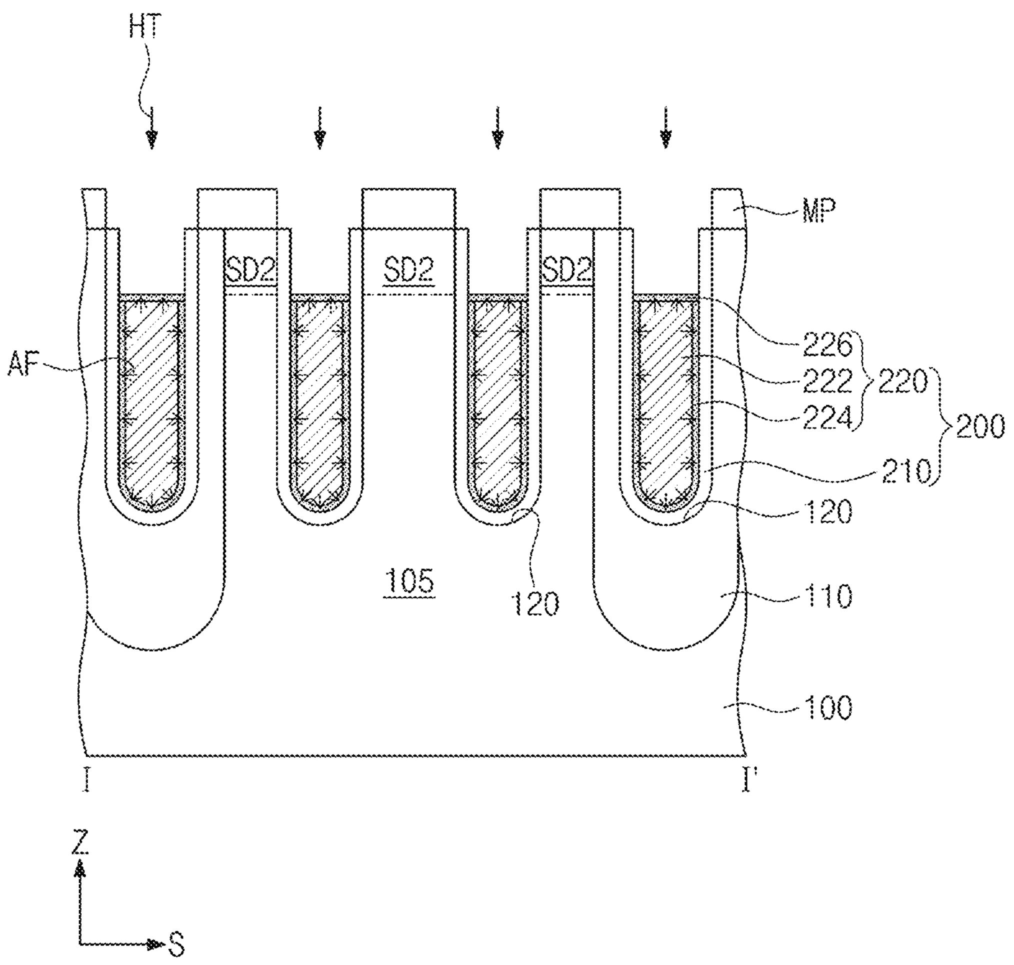
Figure 12B:
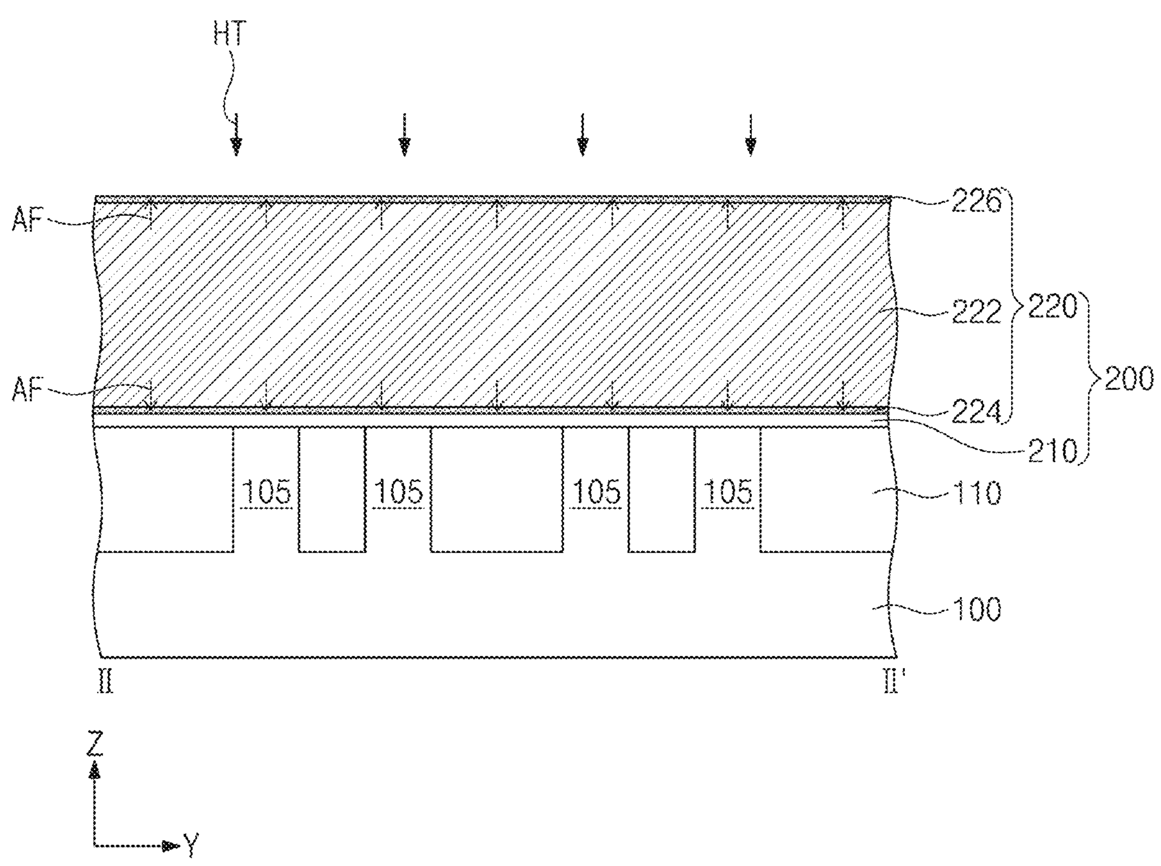

Referring to FIGS. 1, 12A, and 12B, a first interface layer 224 and a second interface layer 226 may be formed by performing a second process. For example, the first interface layer 224 and the second interface layer 226 may be formed by diffusing nitrogen atoms in the conductive layer 222 into a part of the conductive layer 222. Here, the part of the conductive layer 222 means a part adjacent to outer surfaces of the conductive layer 222. For example, the part may be a part of the conductive layer 222 adjacent to an interface between the conductive layer 222 and gate insulating patterns 210 and a part adjacent to the upper surface of the conductive layer 222. In detail, the first interface layer 224 may be interposed between the conductive layer 222 and trenches 120 or the conductive layer 222 and the gate insulating patterns 210, and the second interface layer 226 may be formed adjacent to the upper surface of the conductive layer 222. A thickness of the first interface layer 224 and a thickness of the second interface layer 226 may be 5 Å to 30 Å.

To describe the second process in more detail, nitrogen atoms of the conductive layer 222 may be diffused to an outer portion of the conductive layer 222 along an arrow AF by the second process. The outer portion of the conductive layer 222 having an increased nitrogen concentration may be formed to form the first interface layer 224 and the second interface layer 226. The nitrogen concentration inside the conductive layer 222 may be lowered. Accordingly, a nitrogen concentration of the first interface layer 224 and the second interface layer 226 may be higher than a nitrogen concentration of the conductive layer 222. Along the diffusion direction AF of the nitrogen atoms, the nitrogen concentration in the first interface layer 224 and the second interface layer 226 may be decrease from the outer surface, lower surface, and upper surface of the conductive layer 222 toward the inside of the conductive layer 222. Alternatively, the nitrogen concentration in the conductive layer 222 may be substantially uniform in the conductive layer 222. The second process may include a heat treatment process. That is, the nitrogen atoms in the conductive layer 222 may be diffused by heat HT provided from the outside. The heat treatment process may include a rapid thermal annealing (RTA) process.

Figure 13A:
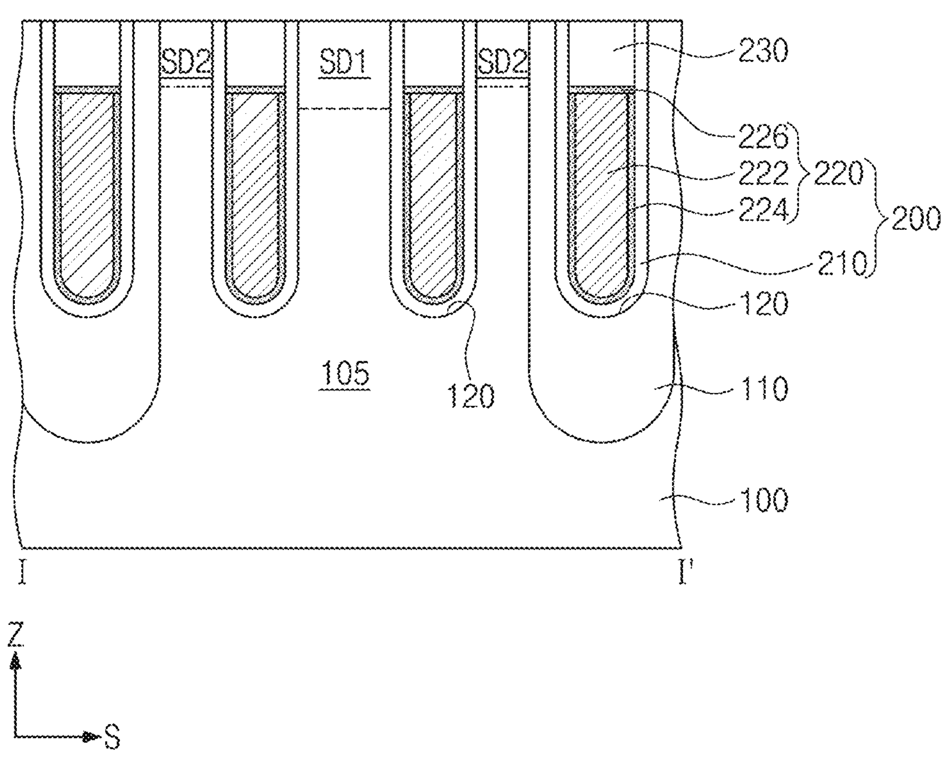
Figure 13B:
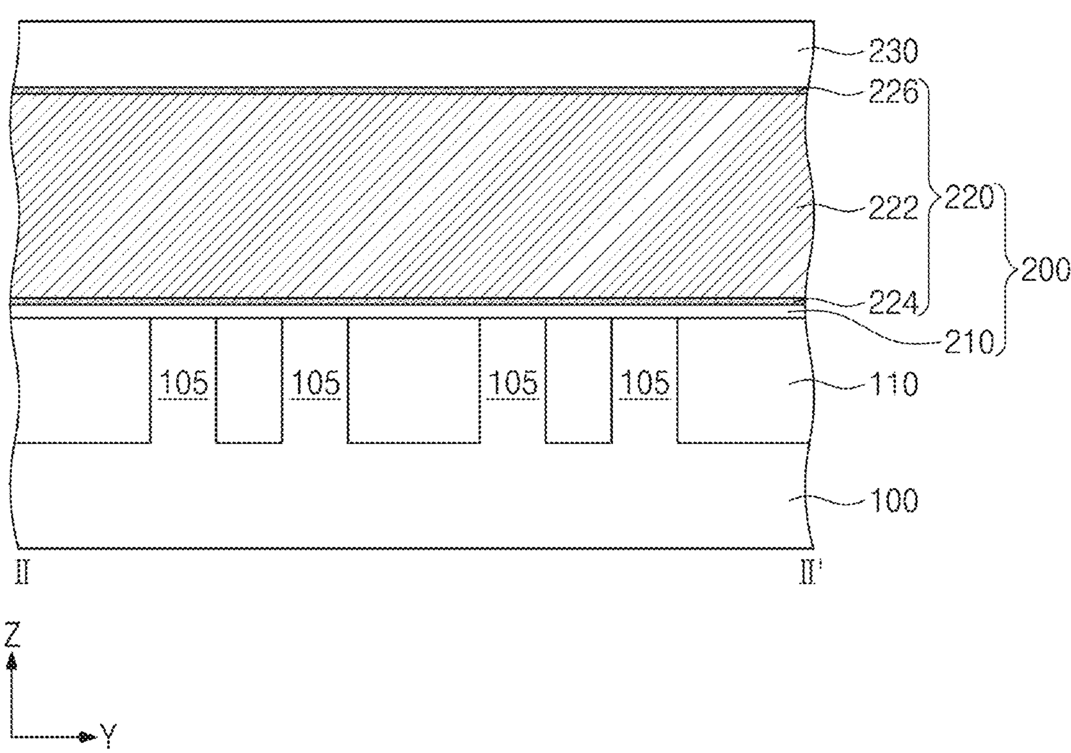

Referring to FIGS. 1, 13A, and 13B, first capping patterns 230 may be formed in the trenches 120. For example, the first capping patterns 230 may be formed by forming a capping layer on the entire surface of the substrate 100 and then performing a planarization process or the like. The first capping pattern 230 may be formed on the second interface layer 226. The first capping patterns 230 may include any one of oxide ($SiO_2$), silicon nitride (SiN), or silicon oxynitride (SiON).

An ion implantation process on the substrate 100 may be performed, and thus a first impurity implantation region SD1 may be formed in regions between two adjacent gate lines 200. The first impurity implantation region SD1 may be doped with the same N-type impurity as the second impurity implantation region SD2. The first impurity implantation region SD1 may extend deeper into the substrate 100 than the second impurity implantation region SD2.

Thereafter, the process described with reference to FIGS. 1, 2A, and 2B may be performed. For example, first pads 310 and second pads 320 may be formed on the substrate 100. The first pads 310 may be connected to the first impurity implantation region SD1, and the second pads 320 may be connected to the second impurity implantation region SD2. A first interlayer insulating layer 400 may be formed on the first and second pads 310 and 320. A direct contact 520 may be formed in the first interlayer insulating layer 400. A bit line 510 and second capping patterns 530 disposed thereon may be formed on the first interlayer insulating layer 400. Insulation spacers 540 covering sidewalls of the bit line 510 may be formed on the first interlayer insulating layer 400. A second interlayer insulating layer 550 may be formed on the first interlayer insulating layer 400, and a planarization process may be performed to expose upper surfaces of the second capping patterns 530. Thereafter, buried contacts 610 connected to the second pads 320 may be formed through the second interlayer insulating layer 550 and the first interlayer insulating layer 400. A support layer 700 may be formed on the second interlayer insulating layer 550. A first electrode 620 connected to the buried contacts 610 may be formed through the support layer 700. A dielectric layer 630 conformally covering the first electrode 620 may be formed, and a second electrode 640 commonly covering the first electrode 620 may be formed, thereby forming a capacitor CA. Accordingly, the semiconductor device described with reference to FIGS. 3A and 3B may be formed.

According to the semiconductor device according to the example embodiments of the inventive concepts, the interface layer may be provided on the surface of the conductive layer, and thus the flat band voltage of the gate lines may be lowered. That is, the work function of the gate lines may be reduced by the interface layer, and the threshold voltage of the semiconductor device may be lowered.

Furthermore, the interface layer may be provided on the sidewalls of the gate lines, and thus the leakage current generated from the upper portions of the gate lines to the impurity implantation regions may be reduced.

In addition, the interface layer and the conductive layer may include the same material as each other, include a different composition ratio from each other, and thus the interfacial resistance between the interface layer and the conductive layer may be small.

The threshold voltage of the semiconductor device may be low while the interfacial resistance between the constituent layers in the gate lines is small. Accordingly, the electrical characteristics of the semiconductor device may be improved.

In the semiconductor device according to the example embodiments of the inventive concepts, the interface layers in the regions in which the transistors are provided may have different configurations, and the work functions of the gate lines in each of the regions may be different from one another. That is, the transistors having different threshold voltages may be provided on each of the regions.

While example embodiments of the inventive concepts have been particularly shown and described, it will be understood by one of ordinary skill in the art that variations in form and detail may be made therein without departing from the spirit and scope of the attached claims.

What is claimed is:

1. A method of fabricating a semiconductor device, the method comprising:

forming a device isolation layer defining active regions on a semiconductor substrate; and forming gate lines intersecting the active regions and buried in the semiconductor substrate, wherein the forming of the gate lines includes:

forming a trench intersecting the active regions in the semiconductor substrate;

forming a gate insulating pattern on a sidewall and a bottom surface of the trench;

forming a conductive layer completely filling the trench on the gate insulating pattern; and performing a heat treatment process on the conductive layer, wherein the conductive layer is a nitride of a first metal, and wherein nitrogen atoms in the conductive layer are diffused toward an outer surface and a lower surface of the conductive layer by the heat treatment process.

2. The method of claim 1, wherein, after the heat treatment process, a concentration of nitrogen atoms in the conductive layer decreases from the outer surface and the lower surface of the conductive layer toward an inside of the conductive layer.

3. The method of claim 1, wherein a part of the conductive layer in which the nitrogen atoms are diffused forms a first interface layer, wherein the first interface layer includes the nitride of the first metal, and wherein a nitrogen concentration in the first interface layer is higher than a nitrogen concentration in the conductive layer.

4. The method of claim 3, wherein the first interface layer is formed adjacent to the outer surface and the lower surface of the conductive layer.

5. The method of claim 3, wherein, after the heat treatment process, other part of the conductive layer in which the nitrogen atoms are diffused forms a second interface layer, and wherein the second interface layer is formed adjacent to an upper surface of the conductive layer.

6. The method of claim 3, wherein a flat band voltage of a material constituting the first interface layer is lower than a flat band voltage of a material constituting the conductive layer.

7. The method of claim 3, wherein a thickness of the first interface layer is from 5Å to 30Å.

8. The method of claim 3, further comprising etching the first interface layer and the conductive layer, wherein an upper surface of the first interface layer and an upper surface of the conductive layer are formed to be positioned at the a same plane.

9. The method of claim 1, wherein the forming of the conductive layer includes reacting a first precursor material including the first metal and a second precursor material including nitrogen, and wherein the forming of the conductive layer is performed at a process temperature of 550 degrees Celsius or more.

10. The method of claim 1, wherein the first metal includes molybdenum (Mo).

11. The method of claim 1, further comprising forming a capping layer on the gate lines.

12. A method of fabricating a semiconductor device, the method comprising:

forming a device isolation layer defining active regions on a semiconductor substrate;

forming trenches intersecting the active regions;

forming a gate insulating pattern on a sidewall and a bottom surface of the trenches;

forming a conductive layer completely filling each of the trenches on the gate insulating pattern, and the conductive layer is a nitride of a first metal;

performing an etch back process to recess the conductive layer to fill a lower portion of each of the trenches;

forming a first interface layer adjacent to an outer surface and a lower surface of the conductive layer, the first interface layer including a nitride of the first metal; and forming a capping layer filling an upper portion of each of the trenches, wherein a nitrogen concentration in the first interface layer is higher than a nitrogen concentration in the conductive layer, wherein the forming of the first interface layer includes performing a heat treatment process on the conductive layer; and diffusing nitrogen atoms in the conductive layer toward the outer surface and the lower surface of the conductive layer through the heat treatment process, to form the first interface layer.

13. The method of claim 12, wherein a part of the nitrogen atoms in the conductive layer are diffused toward an upper surface of the conductive layer through the heat treatment process, to form a second interface layer.

14. The method of claim 12, wherein the forming of the conductive layer includes reacting a first precursor material including the first metal and a second precursor material including nitrogen, and wherein the forming of the conductive layer is performed at a process temperature of 550 degrees Celsius or more.

15. The method of claim 12, wherein a concentration of nitrogen atoms in the first interface layer decreases toward the conductive layer.

16. The method of claim 12, further comprising etching the first interface layer and the conductive layer, wherein an upper surface of the first interface layer and an upper surface of the conductive layer are formed to be provided at a same plane.

17. The method of claim 12, wherein a thickness of the first interface layer is from 5Å to 30Å.

18. The method of claim 12, wherein the first metal includes molybdenum (Mo).

* * * * *